US010903317B1

(12) United States Patent
Frougier et al.

(10) Patent No.: US 10,903,317 B1
(45) Date of Patent: Jan. 26, 2021

(54) GATE-ALL-AROUND FIELD EFFECT TRANSISTORS WITH ROBUST INNER SPACERS AND METHODS

(71) Applicant: GLOBALFOUNDRIES U.S. INC., Santa Clara, CA (US)

(72) Inventors: Julien Frougier, Albany, NY (US); Ruilong Xie, Niskayuna, NY (US); Kangguo Cheng, Schenectady, NY (US); Chanro Park, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/534,317

(22) Filed: Aug. 7, 2019

(51) Int. Cl.
*H01L 29/66* (2006.01)
*H01L 29/06* (2006.01)
*H01L 29/423* (2006.01)
*H01L 29/78* (2006.01)

(52) U.S. Cl.
CPC ...... *H01L 29/0653* (2013.01); *H01L 29/0673* (2013.01); *H01L 29/0684* (2013.01); *H01L 29/42392* (2013.01); *H01L 29/6653* (2013.01); *H01L 29/6681* (2013.01); *H01L 29/66545* (2013.01); *H01L 29/66553* (2013.01); *H01L 29/66818* (2013.01); *H01L 29/7853* (2013.01)

(58) Field of Classification Search
CPC ................................................ H01L 29/42392
See application file for complete search history.

(56) References Cited

U.S. PATENT DOCUMENTS

| | | | |
|---|---|---|---|
| 7,839,605 | B2 | 11/2010 | Parker |
| 8,421,890 | B2 | 4/2013 | Benkley, III |
| 9,064,943 | B1 | 6/2015 | Anderson et al. |
| 9,508,796 | B2 | 11/2016 | Kim et al. |
| 9,508,829 | B1 | 11/2016 | Cheng et al. |

(Continued)

FOREIGN PATENT DOCUMENTS

WO 2018203170 A1 11/2018

OTHER PUBLICATIONS

Disclosed Anonymously, "Inner Spacer Formation Using a Deposition-Etch Technique for Beyond-7nm Nanosheet CPP Scaling", www.IP.com, IPCOM000253603D, Apr. 16, 2018, pp. 1-8.

(Continued)

*Primary Examiner* — Moazzam Hossain
(74) *Attorney, Agent, or Firm* — Gibb & Riley, LLC

(57) ABSTRACT

A gate-all-around field effect transistor (GAAFET) and method. The GAAFET includes nanosheets, a gate around center portions of the nanosheets, and inner spacers aligned below end portions. The nanosheet end portions are tapered from the source/drain regions to the gate and the inner spacers are tapered from the gate to the source/drain regions. Each inner spacer includes: a first spacer layer, which has a uniform thickness and extends laterally from the gate to an adjacent source/drain region; a second spacer layer, which fills the space between a planar top surface of the first spacer layer and a tapered end portion of the nanosheet above; and, for all but the lowermost inner spacers, a third spacer layer, which is the same material as the second spacer layer and which fills the space between a planar bottom surface of the first spacer layer and a tapered end portion of the nanosheet below.

20 Claims, 32 Drawing Sheets

(56) References Cited

U.S. PATENT DOCUMENTS

| | | |
|---|---|---|
| 9,691,850 B2 | 6/2017 | Cheng et al. |
| 9,716,158 B1 | 7/2017 | Cheng et al. |
| 9,881,998 B1 | 1/2018 | Cheng et al. |
| 9,923,055 B1 | 3/2018 | Cheng et al. |
| 9,941,352 B1 | 4/2018 | Bi et al. |
| 10,014,390 B1 | 7/2018 | Bouche et al. |
| 10,170,584 B2 | 1/2019 | Guillom et al. |
| 10,211,307 B2 | 2/2019 | Ching et al. |
| 10,269,983 B2 | 4/2019 | Frougier et al. |
| 2016/0190312 A1 | 6/2016 | Zhang et al. |
| 2018/0047834 A1 | 2/2018 | Chao et al. |
| 2018/0240664 A9 | 8/2018 | Varadarajan et al. |
| 2018/0277656 A1 | 9/2018 | Chao et al. |
| 2018/0323202 A1* | 11/2018 | Cheng .................. H01L 23/5256 |
| 2018/0331232 A1 | 11/2018 | Frougier et al. |
| 2019/0058052 A1 | 2/2019 | Frougier et al. |
| 2019/0237559 A1 | 8/2019 | Cheng et al. |
| 2020/0066839 A1* | 2/2020 | Zhang .................. H01L 29/775 |
| 2020/0098879 A1* | 3/2020 | Lee .................. H01L 29/66553 |
| 2020/0105929 A1* | 4/2020 | Zhang .................. H01L 29/7827 |

OTHER PUBLICATIONS

Disclosed Anonymously, "Dual Stage Inner Spacer Formation for Nanosheet-FET," IPCOM000253328D, www.ip.com, Mar. 22, 2018, pp. 1-6.

Loubet et al., "Stacked Nanosheet Gate-All-Around Transistor to Enable Scaling Beyond FinFET," Symposium on VLSI Technology Digest of Technical Papers, 2017, pp. T230-T231.

\* cited by examiner

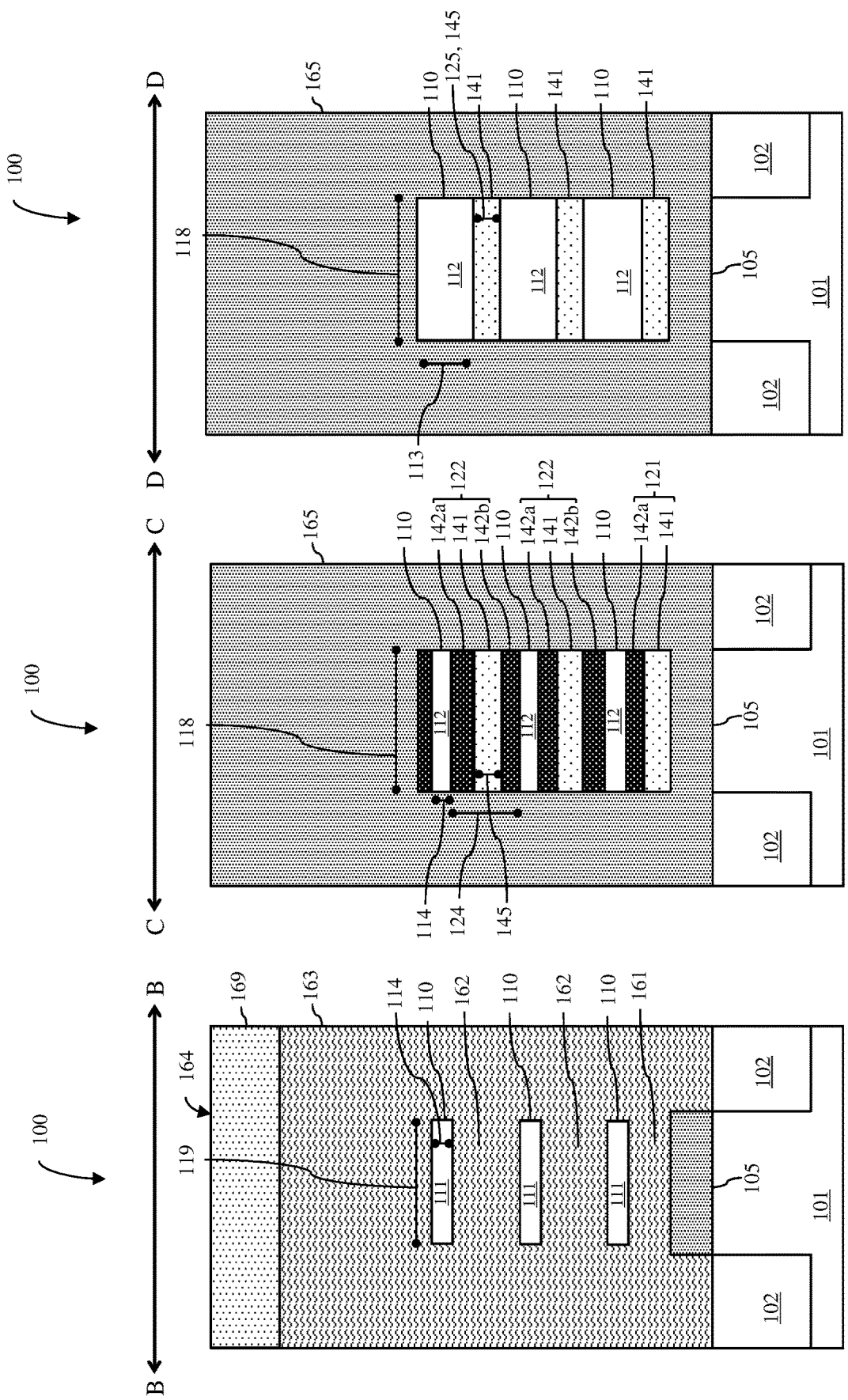

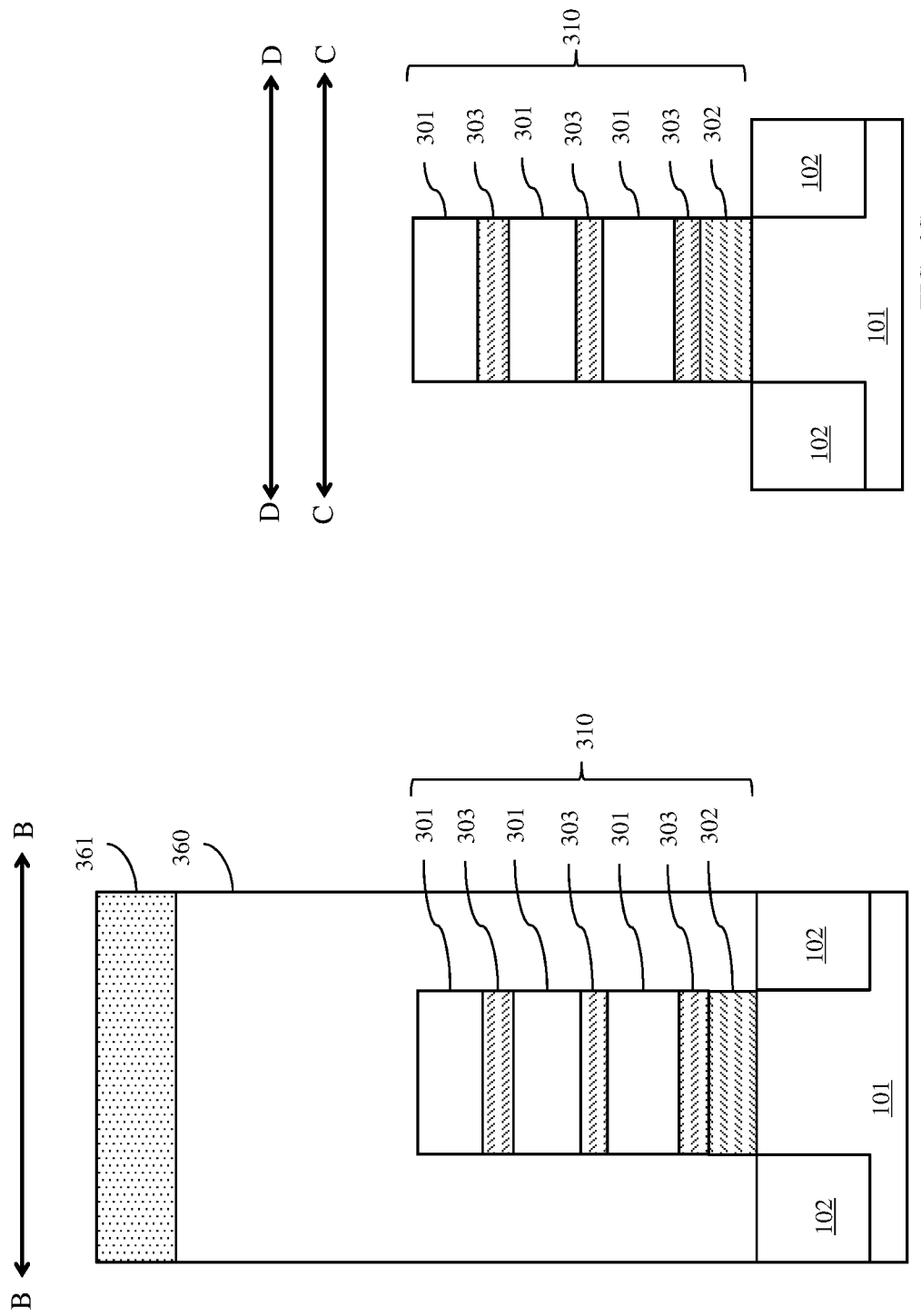

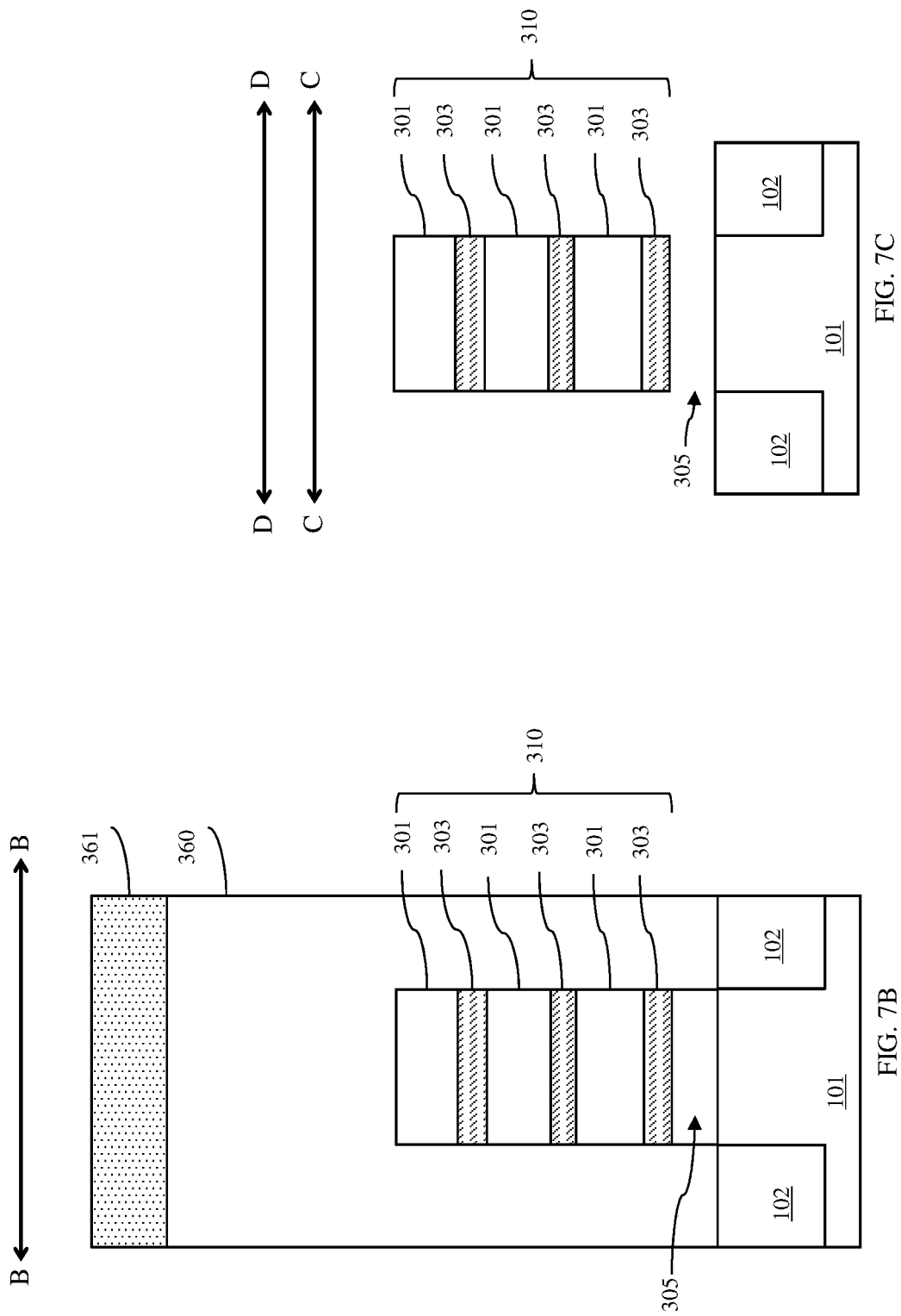

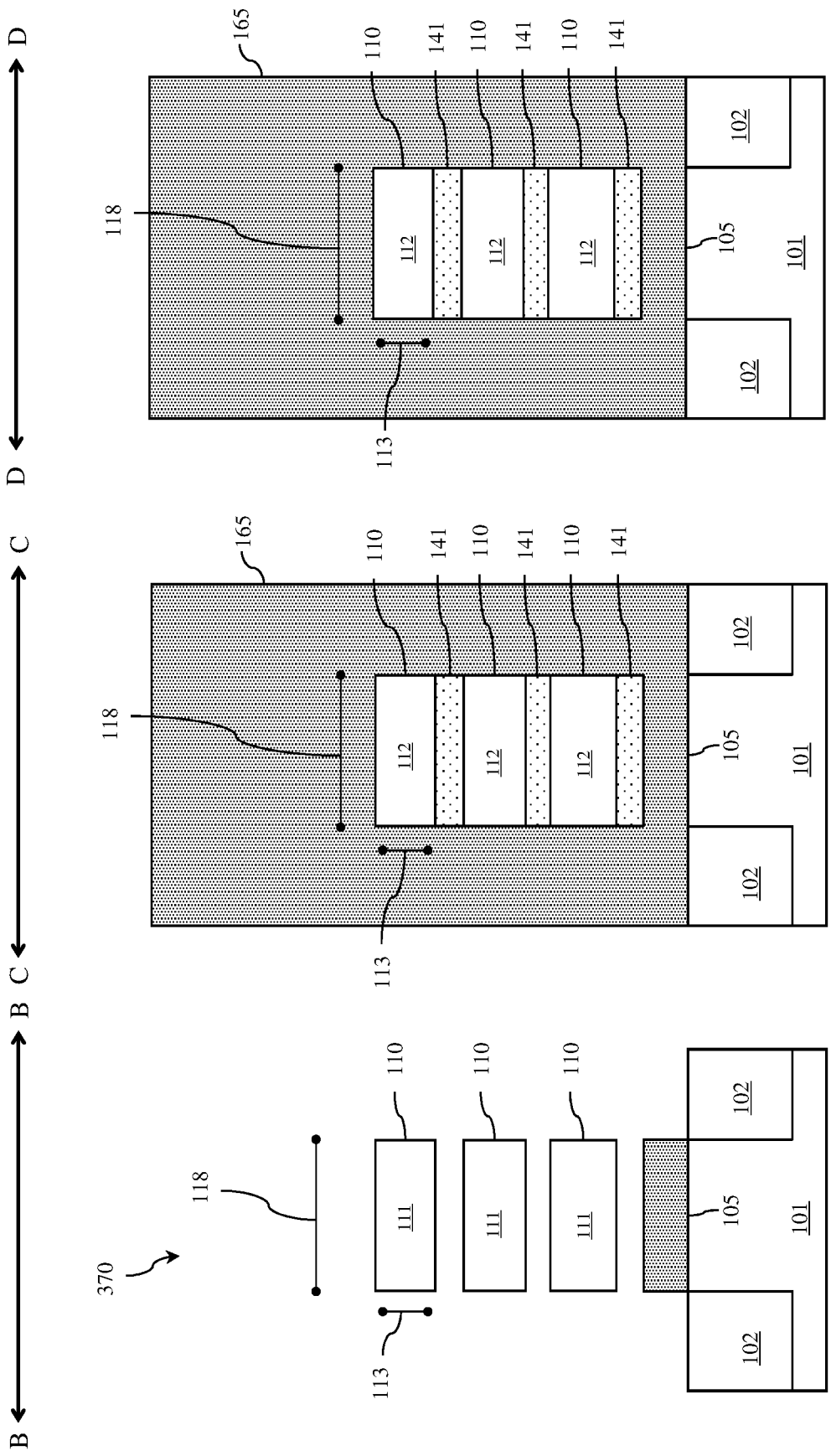

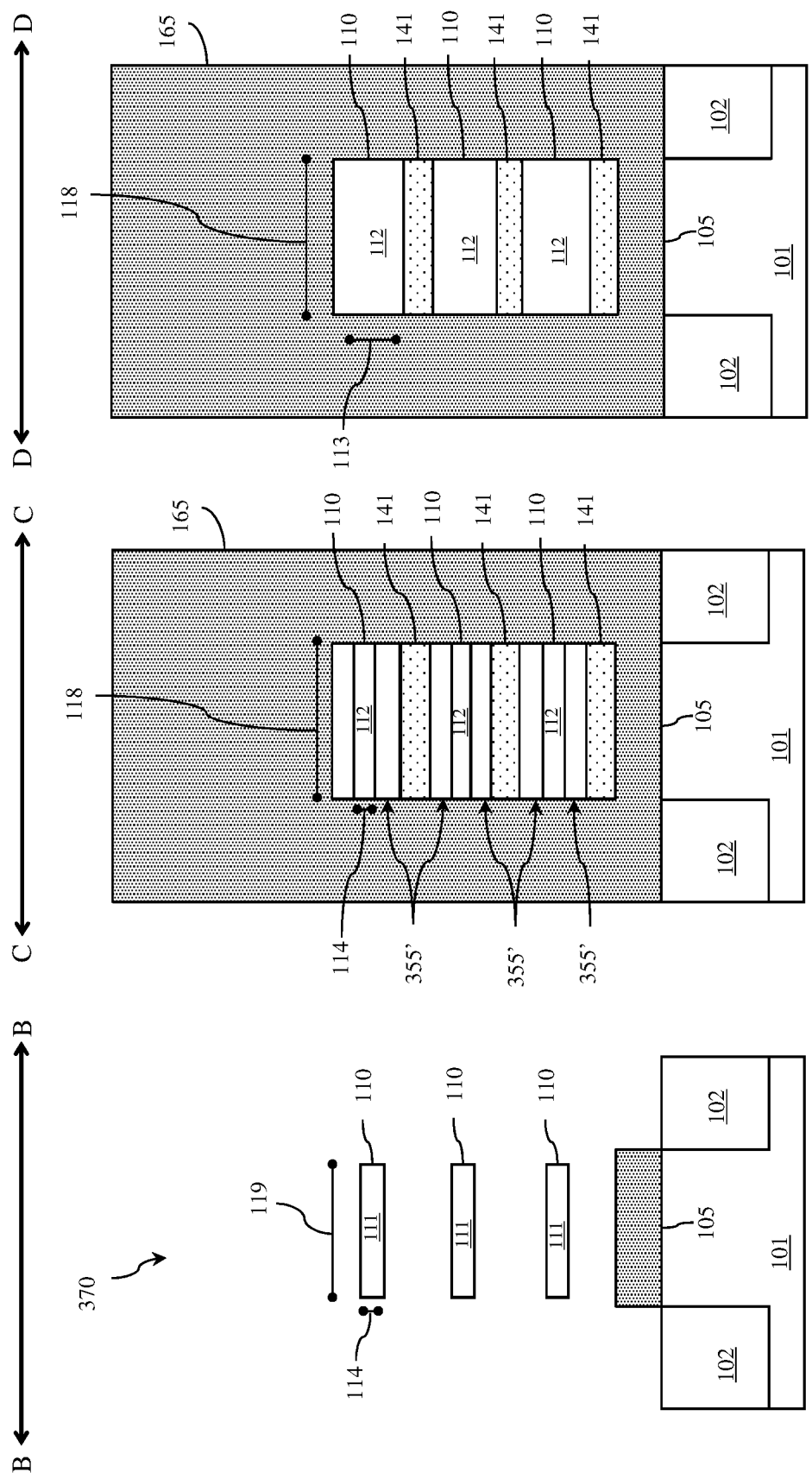

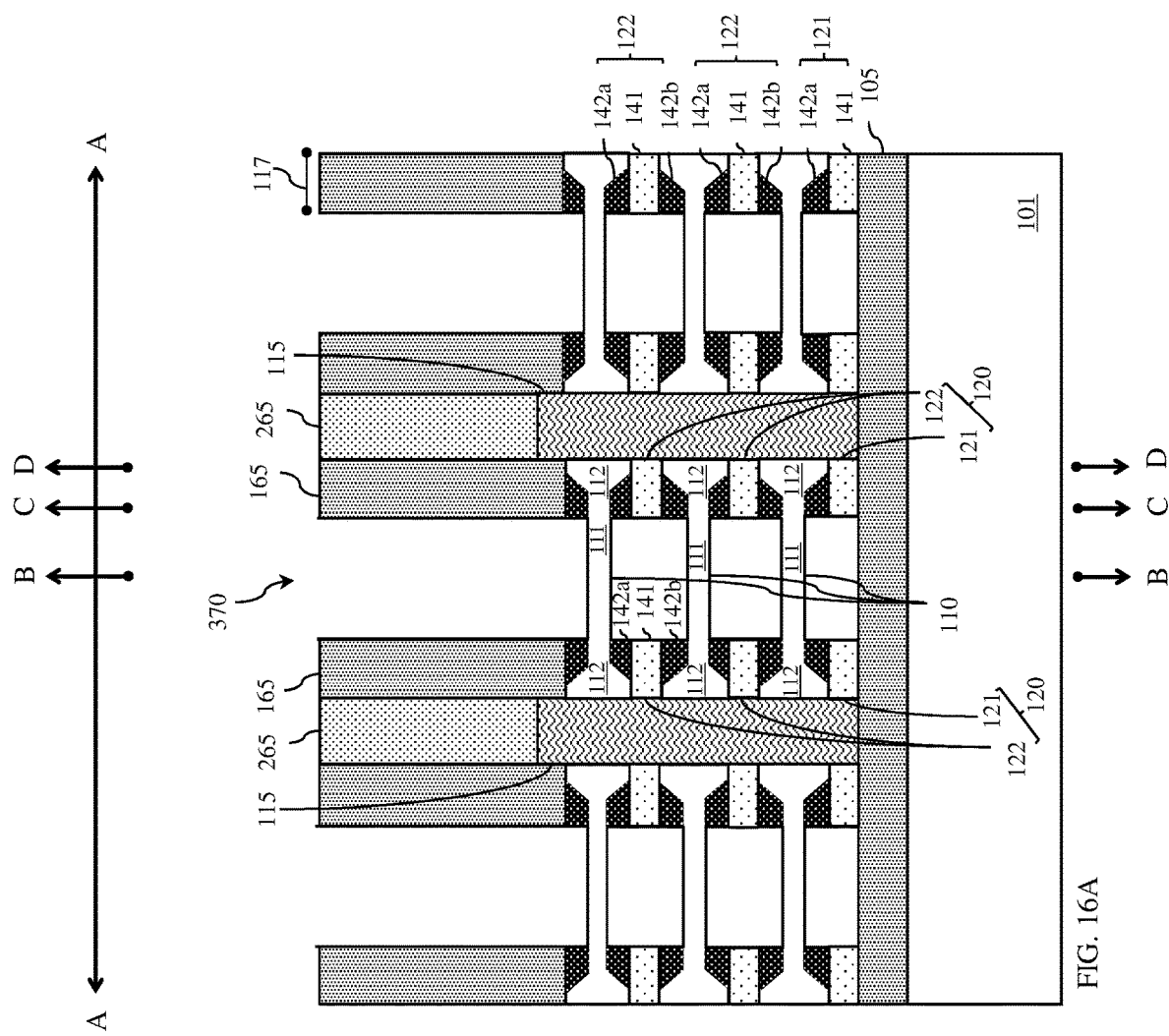

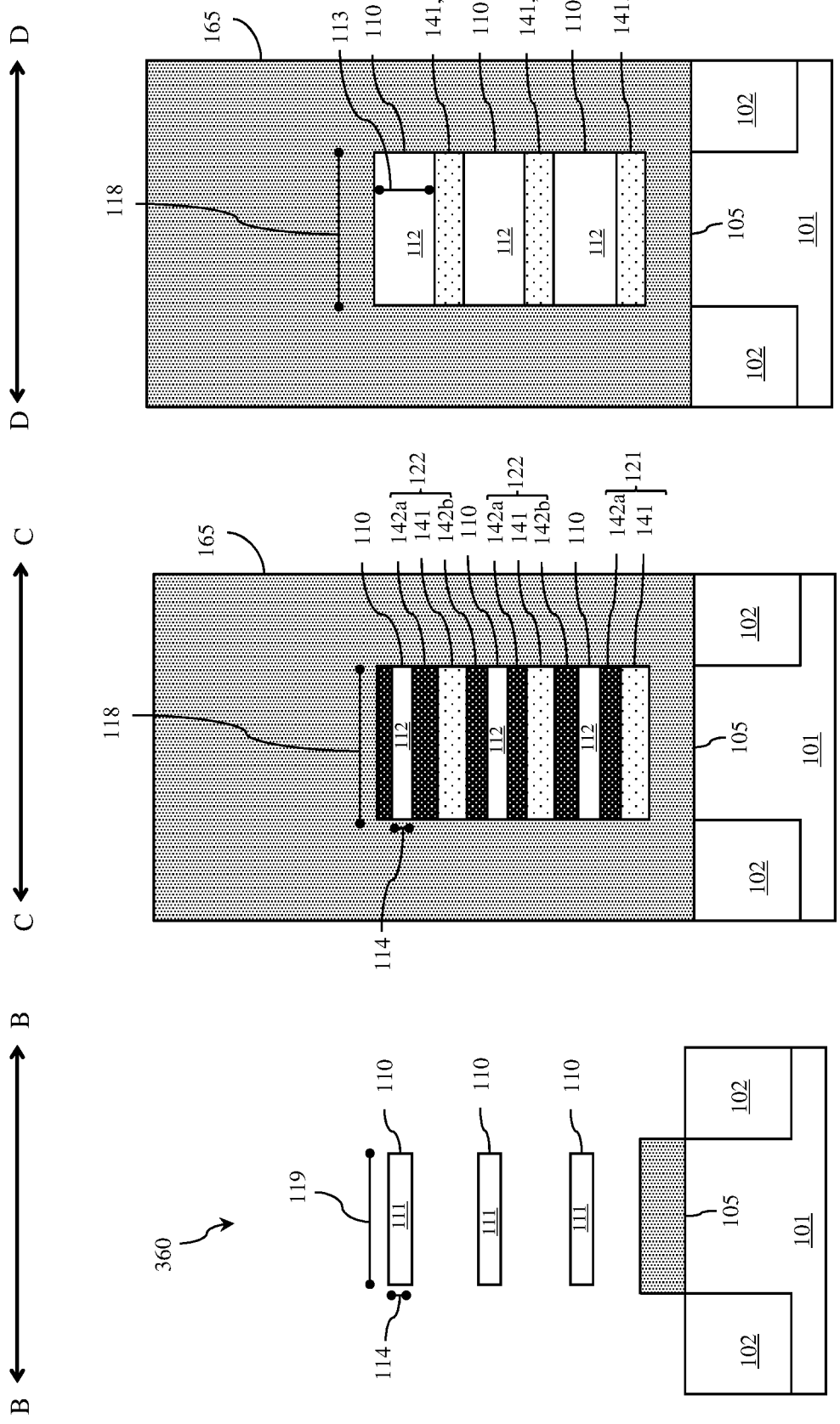

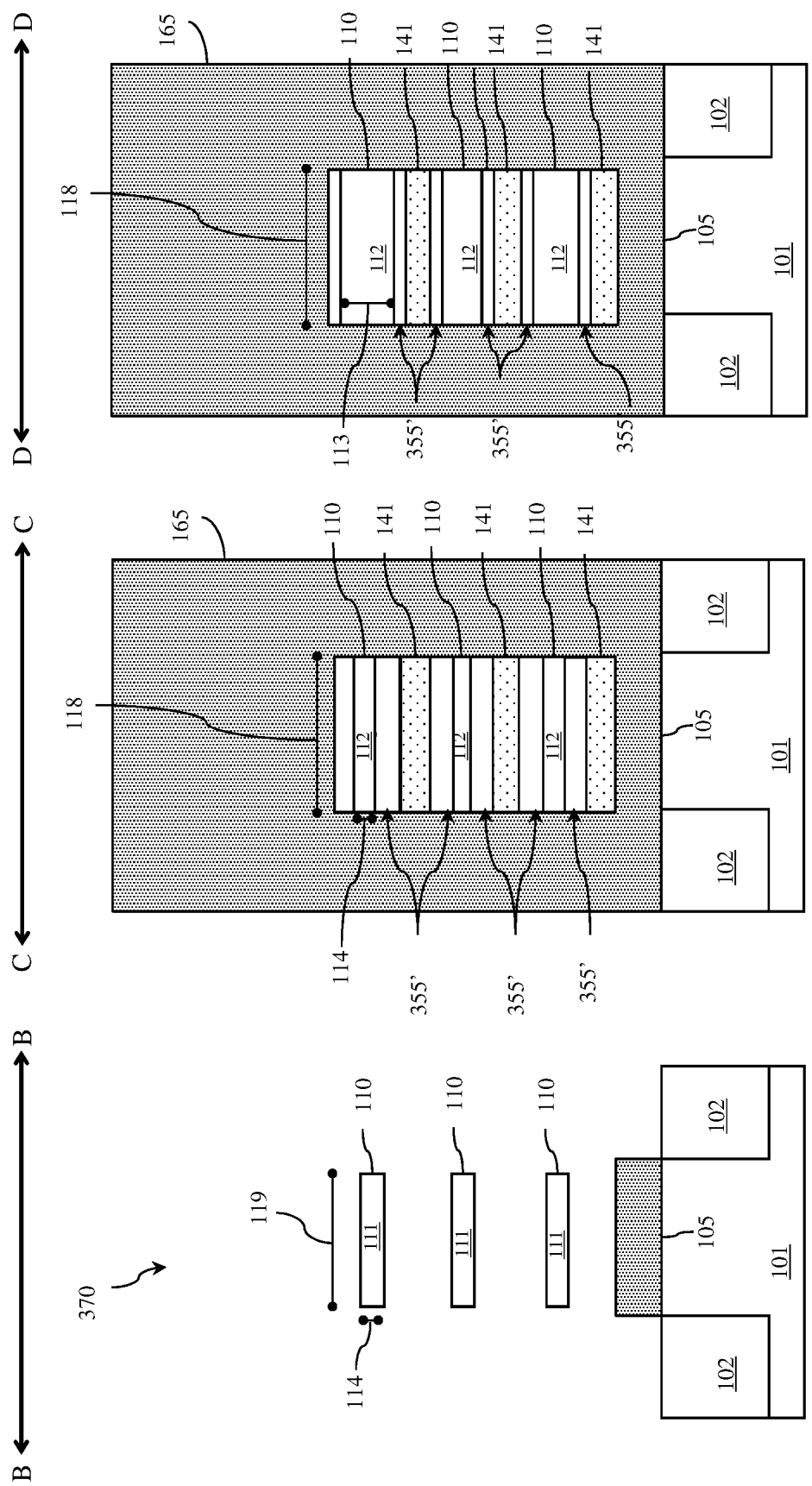

GATE-ALL-AROUND FIELD EFFECT TRANSISTORS WITH ROBUST INNER SPACERS AND METHODS

BACKGROUND

Field of the Invention

The present invention relates to gate-all-around field effect transistors (GAAFETs) and, more particularly, to nanosheet-type GAAFETs with robust inner spacers and methods of forming the GAAFETs.

Description of Related Art

Integrated circuit (IC) design decisions are often driven by device performance, scalability, and manufacturability. For example, recently, to improve device drive current and electrostatics and to allow for further device size scaling, gate-all-around field effect transistors (GAAFETs) and, particularly, nanosheet-type GAAFETs were developed. A nanosheet-type GAAFET is a type of FET that includes source/drain regions and semiconductor nanosheets that extend laterally between the source/drain regions. The nanosheets are stacked vertically (i.e., one above the other) and are physically separated from each other. A gate wraps around the center portion of each of the nanosheets (i.e., is adjacent to the top, bottom and opposing sides of the center portions of each of the nanosheets), thereby defining channel regions within the nanosheets. Dielectric spacers provide electrical isolation between the gate and the adjacent source/drain regions. As with other types of FETs (e.g., planar FETs and fin-type FETs (FINFETs)), the dielectric spacers in a GAAFET include dielectric gate sidewall spacers that are positioned laterally immediately adjacent to the external sidewalls of the gate. Additionally, the dielectric spacers in a GAAFET include dielectric inner spacers, which are positioned laterally between the sidewalls of internal portions of the gate (i.e., the portions of the gate below each channel region) and the adjacent source/drain regions. Unfortunately, with device size scaling, it has become challenging to form robust inner spacers for a GAAFET using conventional processing techniques.

SUMMARY

Disclosed herein are embodiments of a gate-all-around field effect transistor (GAAFET) with robust inner spacers. Generally, in each of the embodiments, the GAAFET can include source/drain regions. The GAAFET can also include a stack of semiconductor nanosheets. Each nanosheet can have end portions (including source/drain extension regions) adjacent to the source/drain regions and a center portion (including a channel region) positioned laterally between the end portions. The GAAFET can further include a gate, which is wrapped around the center portion of each nanosheet such that internal portions of the gate are aligned between center portions of the nanosheets, respectively. The end portions of each nanosheet can be tapered from the source/drain regions toward the center portion. That is, each nanosheet can have a maximum nanosheet thickness in the end portions adjacent to the source/drain regions and a minimum nanosheet thickness in the end portions adjacent to the gate and further across the center portion. The GAAFET can further include the robust inner spacers, which are aligned below the end portions of each nanosheet and which are tapered from the gate toward the source drain regions. That is, each inner spacer can have a maximum spacer thickness adjacent to the gate and a minimum spacer thickness adjacent to the source/drain regions. As discussed further in the detailed description section, the shape of the inner spacers can be defined by the shapes of the end portions of the nanosheet above and, in the case of all but the lowermost inner spacers, by the shapes of the end portions of the nanosheet below.

In any case, each inner spacer can include a first spacer layer, a second spacer layer and, in the case of all but the lowermost inner spacers, a third spacer layer. The first spacer layer can have an essentially uniform width and can be positioned laterally between and in contact with a sidewall of an internal portion of the gate and a sidewall of an adjacent source/drain region. The second spacer layer can have a non-uniform width, can extend vertically between and be in contact with the top surface of the first spacer layer and the bottom surface of a tapered end portion of a nanosheet above, and can also be positioned laterally immediately adjacent to the sidewall of the internal portion of the gate. The third spacer layer, which as mentioned above is in all but the lowermost inner spacers, can have a non-uniform width, can extend vertically between and be in contact with the bottom surface of the first spacer layer and the top surface of an end portion of a nanosheet below, and can also be positioned laterally immediately adjacent to the sidewall of the internal portion of the gate.

In one specific embodiment of the GAAFET, within each inner spacer, the second spacer layer can be shorter in length than the first spacer layer and can be physically separated from the adjacent source/drain region by a tapered end portion of the nanosheet above. Similarly, the third spacer layer (which as mentioned above is in all but the lowermost inner spacers) can be shorter in length than the first spacer layer and can be physically separated from the adjacent source/drain region by a tapered end portion of the nanosheet below.

In another specific embodiment of the GAAFET, within each inner spacer, the second spacer layer can have essentially the same length as the first spacer layer and, like the first spacer layer, can be positioned laterally between and in contact with the sidewall of the internal portion of the gate and the sidewall of the adjacent source/drain region. Similarly, the third spacer layer (which as mentioned above is in all but the lowermost inner spacers) can have essentially the same length as the first and second spacer layers and can be positioned laterally between and in contact with the sidewall of the internal portion of the gate and the sidewall of the adjacent source/drain region.

GAAFET embodiments are also disclosed where, within the inner spacers, the dielectric spacer material of the first spacer layer is the same as the dielectric spacer material of the second and third spacer layers or the dielectric spacer material of the first spacer layer is different than that of the second and third spacer layers.

GAAFET embodiments are also disclosed where, within the inner spacers, the second and third spacer layers are either solid spacer layers or contain air-gaps.

Also disclosed herein are method embodiments for forming the above-described gate-all-around field effect transistor (GAAFET) with robust inner spacers. Generally, the method embodiments can include forming a partially completed GAAFET structure that includes a stack of semiconductor nanosheets, wherein the nanosheets extend laterally between source/drain regions, where each nanosheet has end portions adjacent to the source/drain regions and a center portion positioned laterally between the end portions, where first spacer layers fill inner spacer cavities that are aligned below the end portions of the nanosheets, and where the center portions of the nanosheets are exposed in a gate opening. The method embodiments can further include thinning the exposed center portions of the nanosheets within the gate opening to increase the separation distance between the nanosheets. This thinning can be perform using, for example, a selective isotropic etch process that, not only thins the center portions of the nanosheets, but also causes the end portions of each nanosheet to become tapered from the source/drain regions toward the center portion and, thereby enlarges the inner spacer cavities to expose at least the top surfaces of the first spacer layers. As discussed further in the detailed description section, in all but the lowermost nanosheet in the stack, this thinning process will also expose the bottom surfaces of the first spacer layers.

The method embodiments can further include forming second spacer layers in the enlarged inner spacer cavities adjacent to the first spacer layers in order to complete formation of inner spacers. For example, dielectric spacer material can be conformally deposited into the gate opening and enlarged inner spacer cavities and then an isotropic etch process can be performed so as to remove any of the dielectric spacer material that extends outside the enlarged inner spacer cavities, thereby forming the second spacer layers for each of the inner spacer cavities. As discussed further in the detailed description section, these processes will concurrently form third spacer layers below the first spacer layers in all but the lowermost enlarged inner spacer cavities.

In any case, due to tapered shapes of the end portions of the nanoshapes, each inner spacer in each enlarged inner spacer cavity will be tapered from the gate opening toward a source/drain region. Additionally, each inner spacer will include a first spacer layer that extends laterally completely through the enlarged inner spacer cavity from the gate opening to a sidewall of the source/drain region; a second spacer layer that extends laterally from the gate opening toward the sidewall of the source/drain region and that extends vertically between and is in contact with the top surface of the first spacer layer and the bottom surface of an end portion of a nanosheet above; and, in all but the lowermost inner spacers, a third spacer layer that extends laterally from the gate opening toward the sidewall of the source/drain region and that extends vertically between and is in contact with the bottom surface of the first spacer layer and the top surface of an end portion of a nanosheet below.

The method embodiments can further include forming a gate in the gate opening.

In one specific method embodiment, the process of thinning the center portions of the nanosheets is performed such that vertical surfaces of the source/drain regions are not exposed. Thus, the process of forming the second spacer layers (and, concurrently, the third spacer layers) results in inner spacers where the second spacer layer is shorter in length than the first spacer layer and is physically separated from the adjacent source/drain region by a tapered end portion of the nanosheet above and, similarly, where the third spacer layer (which as mentioned above is in all but the lowermost inner spacers) is shorter in length than the first spacer layer and is physically separated from the adjacent source/drain region by a tapered end portion of the nanosheet below.

In another specific method embodiment, the process of thinning the center portions of the nanosheets exposes vertical surfaces of the source/drain regions. Thus, the process of forming the second spacer layers (and, concurrently, the third spacer layers) results in inner spacers where the second spacer layer has essentially the same length as the first spacer layer and is positioned laterally between and in contact with the sidewall of the internal portion of the gate and the sidewall of the adjacent source/drain region and where the third spacer layer (which as mentioned above is in all but the lowermost inner spacers) has essentially the same length as the first and second spacer layers and is positioned laterally between and in contact with the sidewall of the internal portion of the gate and the sidewall of the adjacent source/drain region.

Method embodiments are also disclosed where the dielectric spacer material used to form the first spacer layer is the same as the dielectric spacer material used to form the second and third spacer layers or the dielectric spacer material used to form the first spacer layer is different than that used to form the second and third spacer layers.

Method embodiments are also disclosed where the dielectric spacer material used to form the second and third spacer layers is conformally deposited such that the resulting second and third spacer layers are solid or such that the resulting second and third spacer layers contain air-gaps.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 1A-1D and 1E are different cross-section diagrams and a top view diagram, respectively, of a semiconductor structure formed according to the flow diagram of FIG. 4 and including an embodiment of a nanosheet-type gate-all-around field effect transistor (GAAFET) with robust inner spacers;

FIGS. 6A-6C are different cross-section diagrams illustrating a partially completed structure formed according to the flow diagram of FIG. 4;

FIGS. 7A-7C are different cross-section diagrams illustrating a partially completed structure formed according to the flow diagram of FIG. 4;

FIGS. 14A-14D are different cross-section diagrams illustrating a partially completed structure formed according to the flow diagram of FIG. 4;

FIGS. 15A-15D are different cross-section diagrams illustrating a partially completed structure formed according to the flow diagram of FIG. 4 and specifically for the GAAFET configuration shown in FIGS. 1A-1D;

FIGS. 16A-16D are different cross-section diagrams illustrating a partially completed structure formed according to the flow diagram of FIG. 4 and specifically for the GAAFET configuration shown in FIGS. 1A-1D;

FIGS. 17A-17D are different cross-section diagrams illustrating a partially completed structure formed according to the flow diagram of FIG. 4 and specifically for the alternative GAAFET configuration shown in FIGS. 2A-2D;

DETAILED DESCRIPTION

Figure 1A:
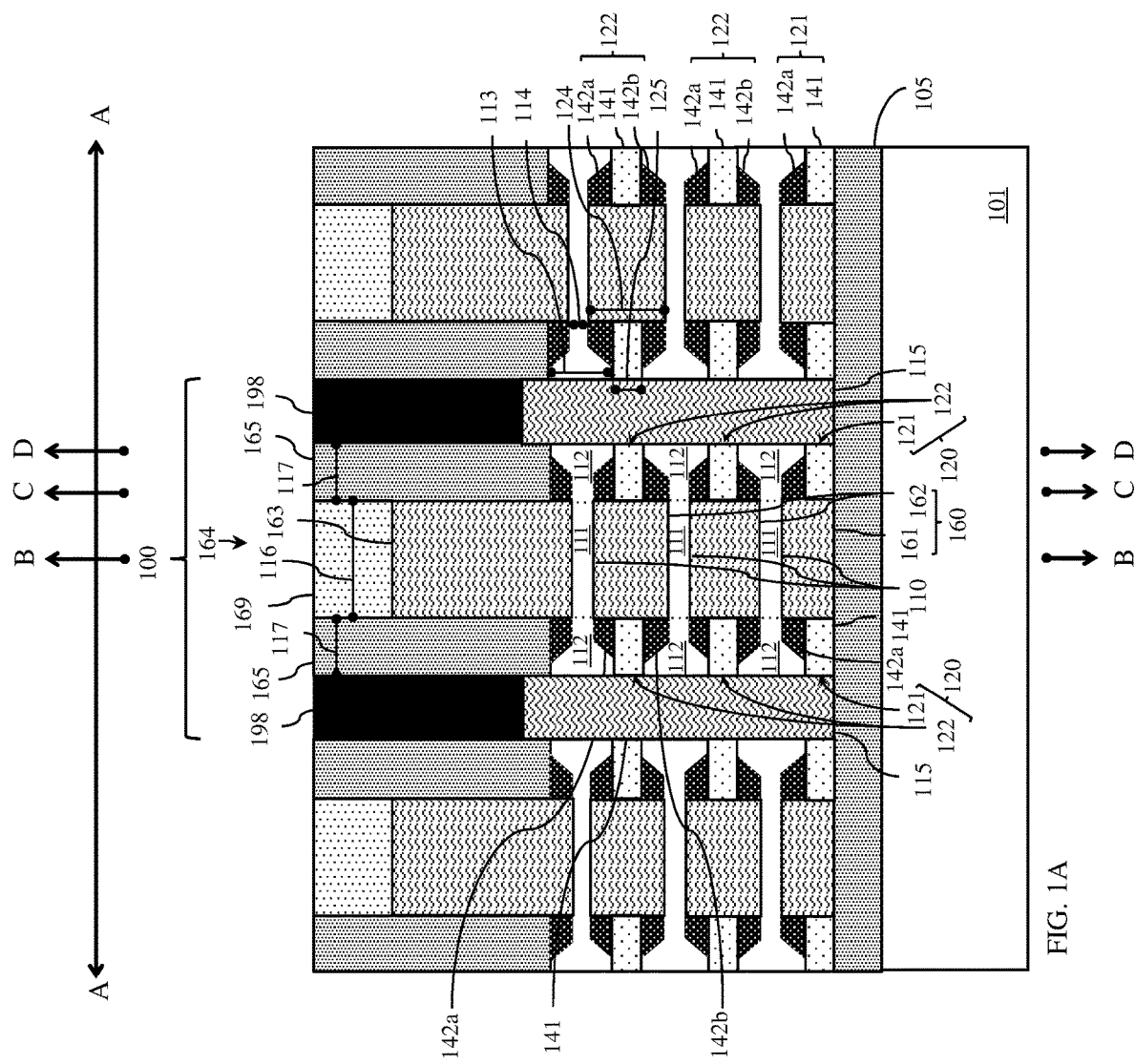

As mentioned above, with device size scaling, it has become challenging to form robust inner spacers for nanosheet-type gate-all-around field effect transistors (GAAFETs) using conventional processing techniques. Specifically, conventional GAAFET processing techniques typically include forming source/drain recesses in exposed portions of a multi-layer semiconductor body between adjacent sacrificial gates and etching back exposed vertical surfaces of alternating layers of the remaining portion of the multi-layer semiconductor body within the source/drain recesses in order to form inner spacer cavities. A layer of dielectric spacer material is then conformally deposited so as to fill the inner spacer cavities. Next, excess dielectric spacer material (i.e., any dielectric spacer material deposited outside of the inner spacer cavities) is selectively removed, thereby completing formation of inner spacers within the inner spacer cavities. However, with device size scaling and, particularly, as gate pitch decreases with each new technology node, the dielectric spacer material can pinch-off in the open space between adjacent gates (given the gate sidewall spacer, etc. thereon) during deposition. This pinching off of the dielectric spacer material may occur before the inner spacer cavities are filled resulting in defective inner spacers. Furthermore, regardless of whether pinching off of the dielectric spacer material occurs before or after the inner spacer cavities are completely filled, closing off of the spaces between adjacent gates can be problematic when trying to remove the excess dielectric spacer material. Specifically, the etch process to remove the excess dielectric spacer material is typically a selective isotropic wet etch process that must be tightly controlled in order to ensure that the dielectric spacer material is completely removed from the source/drain recesses, but not removed from the inner spacer cavities. To accomplish this, there must be adequate wet etchant exposure and, for adequate wet etchant exposure, there must be at least some open space (e.g., at least 3 nm) between adjacent gates (given the gate sidewall spacer, etc. thereon). One technique that could be employed to overcome the above-mentioned issues can include forming relatively shallow inner spacer cavities and depositing a relatively thin layer of dielectric spacer material to prevent the dielectric spacer material from pinching off in the spaces between adjacent gates. However, this technique results in relative thin inner spacers. Unfortunately, device size scaling is also associated with an increase in the parasitic capacitance between the source/drain regions and the gate and these thin inner spacers may not adequately reduce this parasitic capacitance.

In view of the foregoing, disclosed herein are embodiments of a gate-all-around field effect transistor (GAAFET) with robust inner spacers and a method of forming the GAAFET. The GAAFET includes stacked nanosheets that extend laterally between source/drain regions. Each nanosheet can have end portions adjacent to the source/drain regions and a center portion between the end portions Like conventional GAAFETs, the disclosed GAAFET embodiments can include a gate that wraps around the center portion of each nanosheet and inner spacers that are aligned below the end portions of each nanosheet. However, unlike conventional GAAFETs, in the disclosed GAAFET embodiments, the end portions of each nanosheet are tapered from the source/drain regions to the gate and the inner spacers are also tapered from the gate to the source/drain regions. Additionally, each inner spacer can include a first spacer layer, which has a uniform thickness and extends laterally from the gate to an adjacent source/drain region; a second spacer layer, which fills the space between the top surface of the first spacer layer and a tapered end portion of the nanosheet above; and, for all but the lowermost inner spacers, a third spacer layer, which is the same material as the second spacer layer and which fills the space between the bottom surface of the first spacer layer and a tapered end portion of the nanosheet below. Also disclosed herein are embodiments of a method of forming such a GAAFET.

More particularly, disclosed herein are embodiments of a nanosheet-type gate-all-around field effect transistor (GAAFET) (e.g., see GAAFET 100 of FIGS. 1A-1E, GAAFET 100' of FIGS. 2A-2D, GAAFET 100" of FIG. 3) with robust inner spacers 120.

Figure 1E:
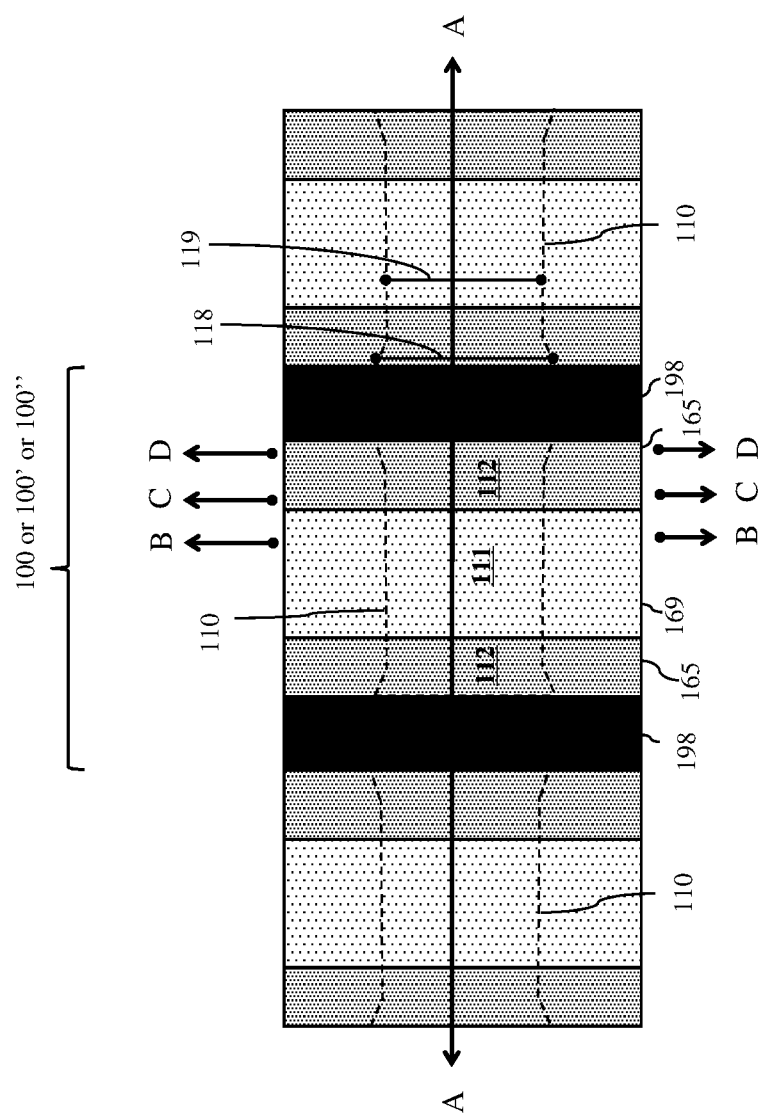
Figure 2A:
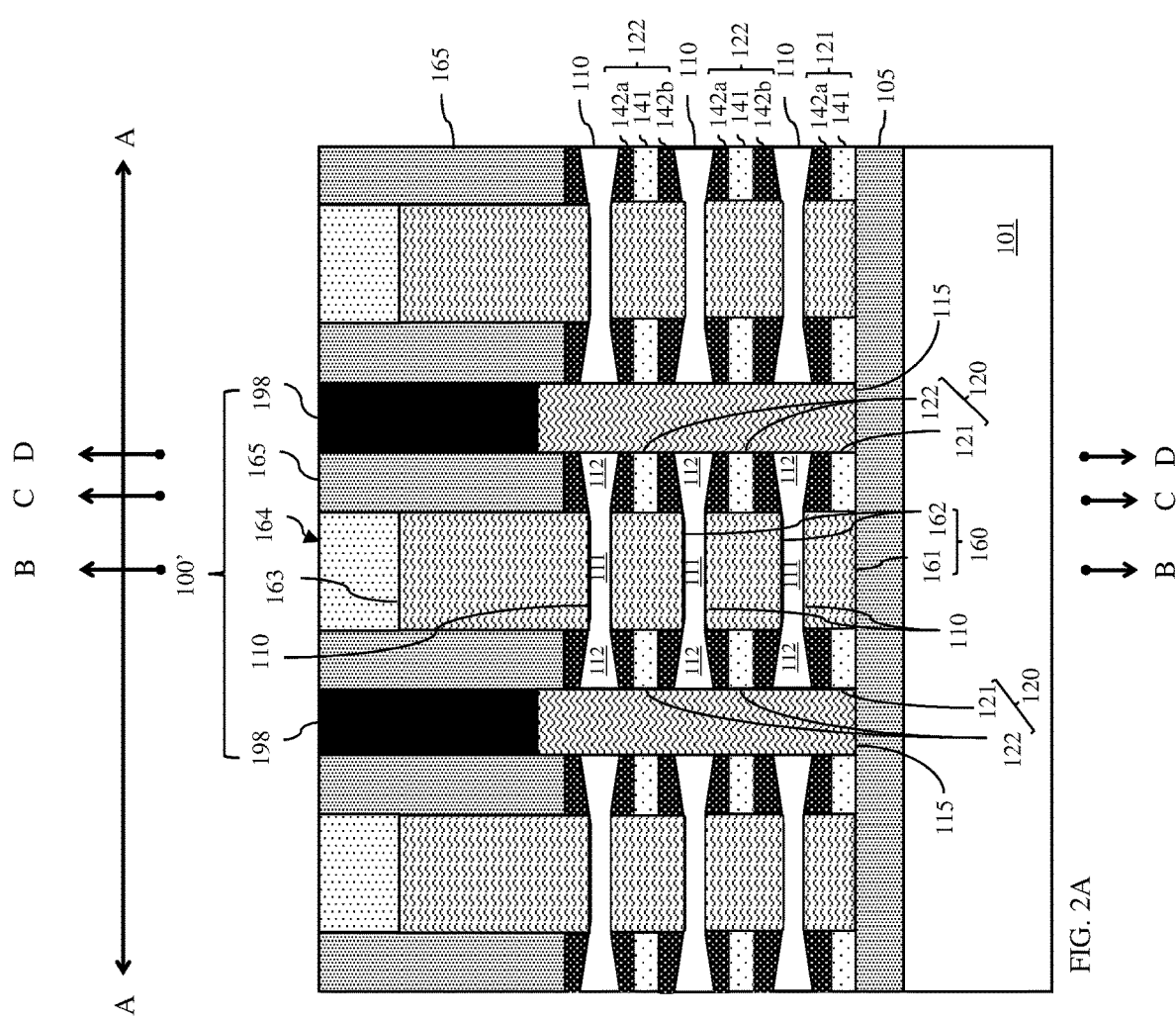
FIGS. 2A-2D are different cross-section diagrams illustrating an alternative configuration for the GAAFET.
Figures 2B, 2C, 2D:
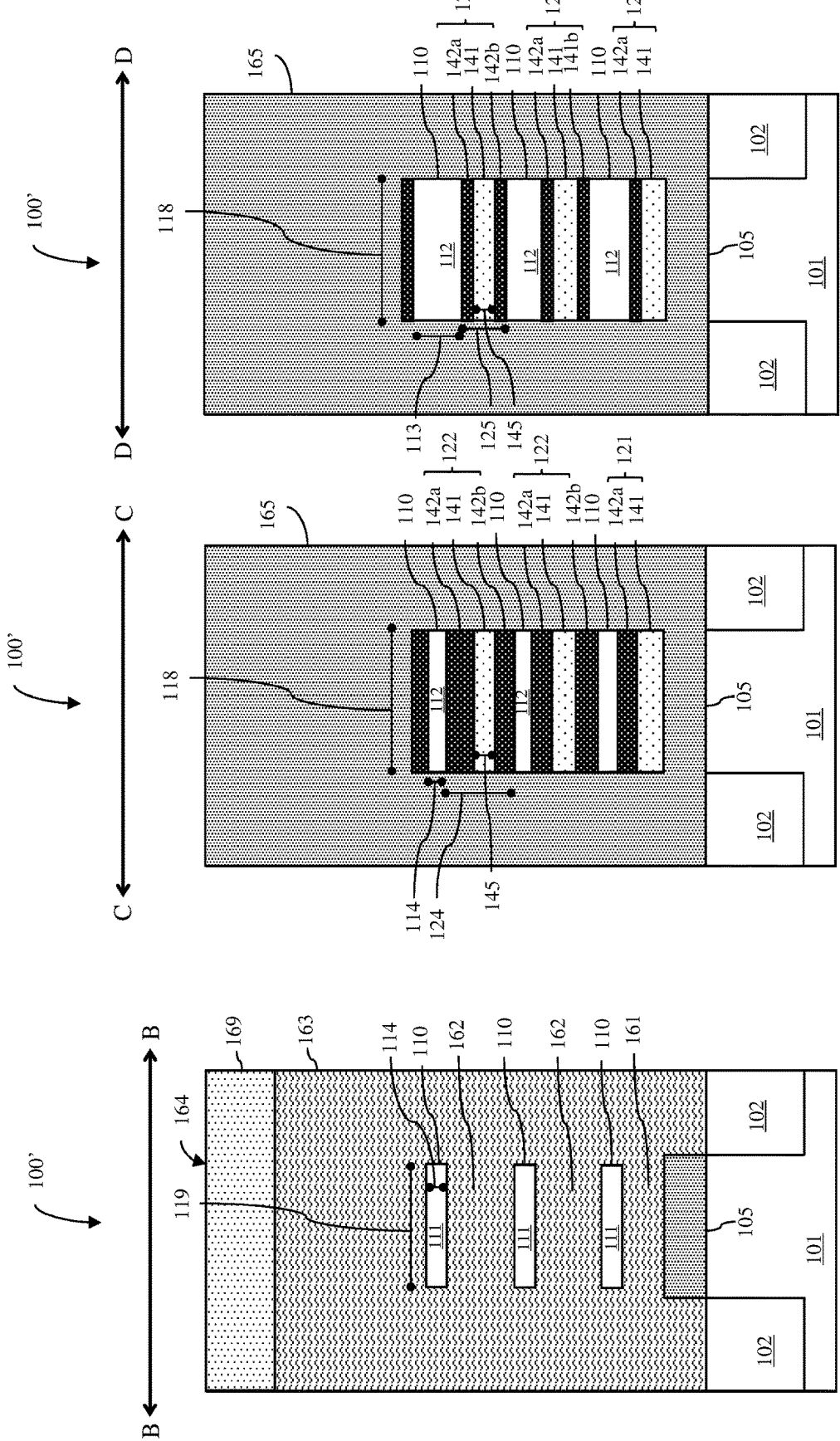
Figure 3:
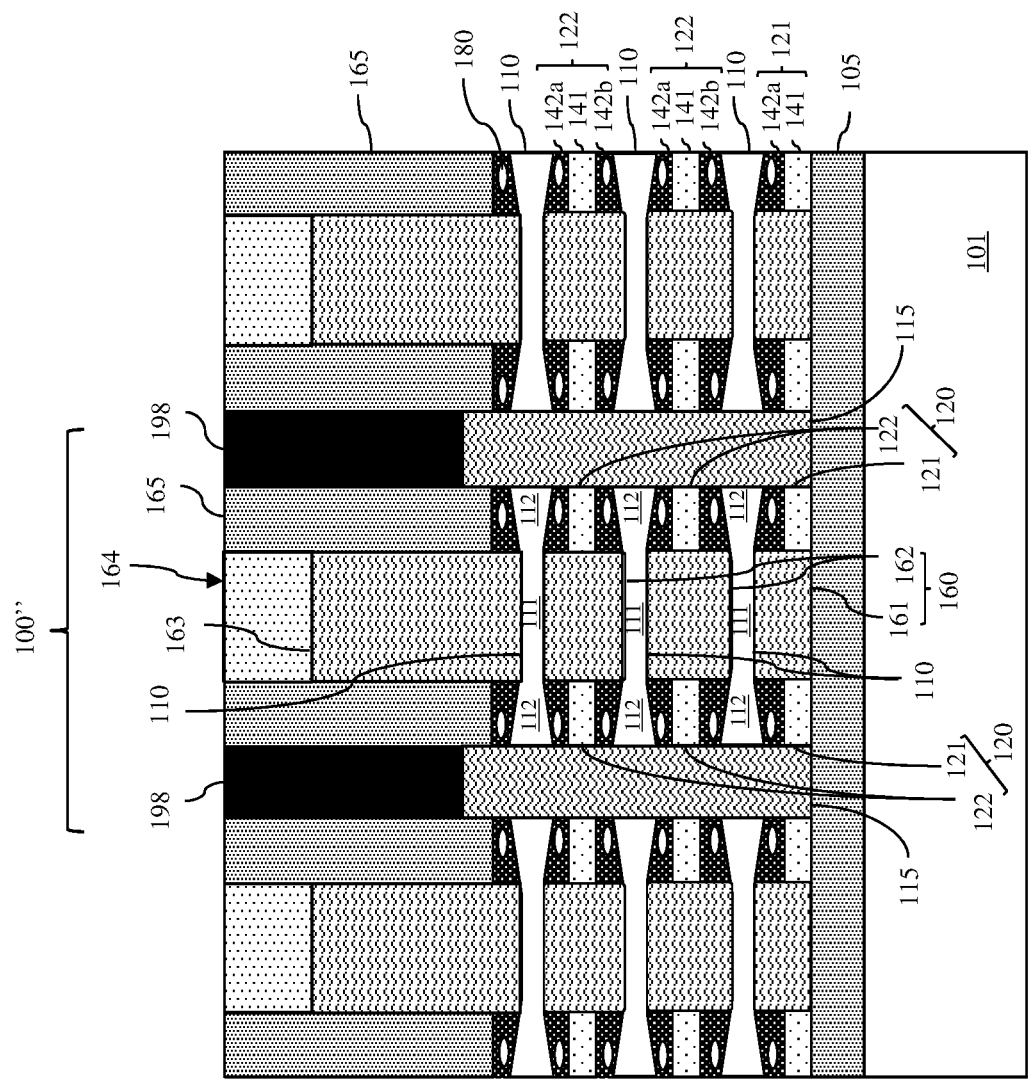
FIG. 3 is a cross-section diagram illustrating an additional alternative configuration for the GAAFET.

FIG. 1A is a vertical cross-section diagram (AA) of the semiconductor structure that extends across the length of the GAAFET 100. FIG. 1B is a different vertical cross-section diagram (BB) of the semiconductor structure that extends across the width of the GAAFET 100 through the gate 164 and channel regions 111. FIG. 1C is a different vertical cross-section diagram (CC) that extends across the width of the GAAFET 100 through a gate sidewall spacer 165 between the gate 164 and a source/drain region 115 and closer to the gate. FIG. 1D is a different vertical cross-section diagram (DD) that extends across the width of the GAAFET 100 also through the gate sidewall spacer 165 between the gate 164 and a source/drain region 115, but closer to the source/drain region 115. FIG. 1E is a top view diagram showing the relative positions of the cross-sections AA, BB, CC, and DD. The shape delineated by the dashed line within FIG. 1E represents a single nanosheet 110 within the GAAFET 100. FIGS. 2A-2D are similarly oriented cross-section diagrams AA, BB, CC, and DD showing an alternative configuration for the GAAFET 100'. FIG. 3 is a similarly oriented cross-section diagram AA for an additional alternative configuration for the GAAFET 100".

Referring to GAAFET 100 in FIGS. 1A-1E, the GAAFET 100' in FIGS. 2A-2D and the GAAFET 100" in FIG. 3, a semiconductor structure can include a semiconductor substrate 101. The semiconductor substrate 101 can be made of a first semiconductor material (e.g., monocrystalline silicon (Si)) or some other suitable monocrystalline semiconductor material.

The semiconductor structure can further include an isolation layer 105 on the top surface of the semiconductor substrate 101. The isolation layer 105 can be, for example, a low-K dielectric material. For purposes of this disclosure, a low-K dielectric material refers to a dielectric material having a dielectric constant (K) that is less than the dielectric constant of silicon dioxide ($SiO_2$) (i.e., K<3.9). Thus, for example, the isolation layer 105 can be silicon boron carbonitride (SiBCN), silicon oxycarbonitride (SiOCN), silicon carbonitride (SiCN) or any other suitable low-K dielectric material.

The semiconductor structure can further include a GAAFET 100 (see FIGS. 1A-1E), 100' (see FIGS. 2A-2B) or 100" (see FIG. 3) above the isolation layer 105. Optionally, the semiconductor structure can include a row of GAAFETs 100, 100', 100" connected in series by shared source/drain regions, as illustrated. The semiconductor structure can further isolation regions 102 in the substrate below the isolation layer 105 and on opposing sides of the GAAFET region such that they run parallel along the length of the GAAFET(s). As illustrated, these isolation regions 102 can be shallow trench isolation (STI) regions. That is, the isolation regions 102 can include trenches, which have been etched into the top surface of the semiconductor substrate 101 and which are filled with an isolation material. The isolation material can be, for example, silicon dioxide ($SiO_2$) or any other suitable isolation material.

The GAAFET 100, 100', 100" can include a pair of source/drain regions 115 above and immediately adjacent to the isolation layer 105. The source/drain regions 115 can include source/drain recesses filled with an epitaxial monocrystalline semiconductor material. The epitaxial monocrystalline semiconductor material can be, for example, epitaxial monocrystalline silicon (Si) or some other suitable epitaxial monocrystalline semiconductor material. In any case, the epitaxial monocrystalline semiconductor material of the source/drain regions 115 can be doped so that the source/drain regions 115 have an appropriate conductivity type and level given the conductivity type of the GAAFET 100, 100', 100". For example, for a P-type GAAFET, the source/drain regions 115 can be doped so as to have P-type conductivity at a relatively high conductivity level (i.e., P+ conductivity); whereas, for an N-type GAAFET, the source/drain regions 115 can be doped so as to have N-type conductivity at a relatively high conductivity level (i.e., N+ conductivity).

The GAAFET 100, 100', 100" can further include multiple semiconductor nanosheets 110. For purposes of this disclosure, a semiconductor nanosheet refers to a relatively thin, elongated, semiconductor body having at least a thickness dimension constrained to 100 nm or less. That is, the thickness of a nanosheet (as measured in a first direction, which is perpendicular to the top surface of the substrate) can be 100 nm or less. Optionally, the length of a nanosheet (as measured in a second direction, which is parallel to the surface of the substrate) from one source/drain region to the other and/or the width of the nanosheet (as measured in a third direction, which is parallel to the surface of the substrate and oriented perpendicular to the second direction) can also be constrained to 100 nm or less. When the thickness of a nanosheet is approximately equal to its width, the nanosheet can be referred to as a nanowire. It should be noted that in prior art GAAFETs the nanosheets typically have an essentially uniform thickness. However, as discussed in greater detail below, in the GAAFET 100, 100', 100" disclosed herein end portions 112 of each nanosheet 110 are relatively thick as compared to the center portion 111.

The nanosheets 110 can extend laterally between the source/drain regions 115 and can be stacked vertically. The lowermost nanosheet can be above and physically separated from the isolation layer 105 and the center portion of the lower most nanosheet can be essentially parallel to the top surface of the isolation layer 105. One or more additional nanosheets can be stacked one above the other such that they are physically separated from each other and such that their center portions are parallel to each other. For purposes of illustration, FIGS. 1A-1E, 2A-2D and 3 show three stacked nanosheets 110. However it should be understood that the figures are not intended to be limiting and that the GAAFET 100, 100', 100" could include any number of two or more nanosheets. In any case, each nanosheet 110 can be made of the first semiconductor material (e.g., monocrystalline silicon (Si)) or some other suitable monocrystalline semiconductor material.

Each nanosheet 110 can include end portions 112 (which contain source/drain extension regions) immediately adjacent to the source/drain regions 115, respectively, and a center portion 111 (which contains a channel region) positioned laterally between the end portions 112. The end portions 112 of each nanosheet 110 can be tapered toward the center portion 111 such that each nanosheet 110 has a maximum nanosheet thickness 113 and a maximum nanosheet width 118 at the junctions between the end portions 112 and the source/drain regions 115 and a minimum nanosheet thickness 114 (which is less than the maximum nanosheet thickness) and a minimum nanosheet width 119 (which is less than the maximum nanosheet width) in the end portions 112 near (i.e., close to) the center portion 111 and further extending across the length of the center portion 111.

In exemplary embodiments, each end portion 112 can have a length 117 that is 3-7 nm (e.g., 5 nm) and the center portion 111 can have a length 116 that is 10-20 nm (e.g., 15 nm) such that the overall length of each nanosheet is 16-34 nm (e.g., 25 nm). Additionally, in exemplary embodiments, the maximum nanosheet thickness 113 can be 11-15 nm (e.g., 13 nm), the minimum nanosheet thickness 114 can be 4-10 nm (e.g., 5 nm), the maximum nanosheet width 118 can be 10-70 nm, and the minimum nanosheet width can be 5-65 nm (but less than the maximum).

The center portions 111 of the nanosheets 110 (i.e., the channel regions for the GAAFET 100, 100', 100") can be either intrinsic (i.e., undoped) or doped so as to have an appropriate conductivity type and level given the conductivity type of the GAAFET. For example, for a P-type GAAFET, the center portions 111 can be either undoped or doped so as to have N-type conductivity at a relatively low conductivity level (i.e., N− conductivity). For a N-type GAAFET, the center portions 111 can be either undoped or doped so as to have P-type conductivity at a relatively low conductivity level (i.e., P− conductivity). The end portions 112 of the nanosheets 110 (i.e., the source/drain extension regions for the GAAFET 100, 100', 100") can be doped so as to have an appropriate conductivity type and level given the conductivity type of the GAAFET. For example, for a P-type GAAFET, the end portions 112 can be doped so as to have P-type conductivity at a relatively low conductivity level (i.e., P− conductivity). For a N-type GAAFET, the end portions 112 can be doped so as to have N-type conductivity at a relatively low conductivity level (i.e., N− conductivity).

The GAAFET 100, 100', 100" can further include a gate 164. The gate 164 can have a bottom surface above and immediately adjacent to the isolation layer 105. The gate 164 can further wrap around (i.e., cover the top, bottom and opposing side surfaces) of the center portions 111 of the nanosheets 110 (i.e., the channel regions), respectively. The gate 164 can be, for example, a replacement metal gate (RMG). The RMG can include: one or more conformal gate dielectric layers (e.g., a thin oxide layer and/or a high-K dielectric layer) immediately adjacent to the channel regions and one or more gate conductor layers (e.g., one or more conformal work function metal layer, a fill metal layer, etc.) on the gate dielectric layer. As discussed in greater detail below the work function metal layers may vary depending upon the conductivity type of the GAAFET. In any case, to avoid clutter in the drawings and to allow the reader to focus on the salient aspects of the disclosed structures, the specific gate dielectric layer(s) and gate conductor layer(s) within the gate 164 are not illustrated.

As illustrated, the gate 164 has internal portions 160 and an external portion 163. The internal portions 160 are aligned below the nanosheets 110 and, particularly, below the center portion of each nanosheet and include a first internal portion 161 (also referred to herein as a lowermost internal portion) and at least one second internal portion 162 (also referred to herein as upper internal portions). The first internal portion 161 extends vertically from the isolation layer 105 to the center portion 111 of the lowermost nanosheet in the stack. Each second internal portion 162 extends vertically between the center portions 111 of adjacent nanosheets 110 in the stack. The external portion 163 extends across the width of the GAAFET 100, 100', 100" above and immediately adjacent to the center portion 111 of the uppermost nanosheet and further extends down opposing sides of the GAAFET 100, 100', 100". Additionally, the gate 164 can be capped by a dielectric gate cap 169. The gate cap 169 can be, for example, a silicon nitride (SiN) gate cap or a gate cap made of some other suitable dielectric gate cap material.

To provide electrical isolation between the gate 164 and the adjacent source/drain regions 115 and to minimize parasitic gate-to-source/drain capacitance, the GAAFET 100, 100', 100" can further include dielectric spacers. The dielectric spacers can include dielectric gate sidewall spacers 165 and dielectric inner spacers 120 including first inner spacers 121 (which are also referred to herein as the lowermost inner spacers) and second inner spacers 122 (which are referred to herein as upper inner spacers).

The gate sidewall spacers 165 can be positioned laterally immediately adjacent to outer sidewalls of the external portion 163 of the gate 164 and, particularly, between the gate 164 and the source/drain regions 115. Thus, gate sidewall spacers 165 can extend across the width of the GAAFET 100, 100', 100" above the end portions 112 of the uppermost nanosheet and can further extend down opposing sides of the GAAFET 100, 100', 100". These gate sidewall spacers 165 can have essentially the same length 117 as the end portions 112 of the nanosheets 110. As discussed in greater detail below with regard to the method, the gate sidewall spacers 165 and the isolation layer 105 can be formed concurrently. Thus, the gate sidewall spacers 165, like the isolation layer 105, can be made of a low-K dielectric material (e.g., silicon boron carbonitride (SiBCN), silicon oxycarbonitride (SiOCN), silicon carbonitride (SiCN) or any other suitable low-K dielectric material).

The inner spacers 120 can be positioned laterally between sidewalls of the internal portions 160 of the gate 164 and the adjacent source/drain regions 115. Specifically, each internal portion of the gate 164 can extend laterally between a pair of inner spacers with each inner spacer 120 being aligned below and immediately adjacent to one of the end portions 112 of one of the nanosheets 110 and further positioned laterally between an internal portion of the gate 164 and an adjacent source/drain region 115. The first inner spacers 121 (i.e., the lowermost inner spacers) are above and immediately adjacent to the isolation layer 105, on opposing sides of the first internal portion 161 (i.e., the lowermost internal portion) of the gate 164, and further aligned below end portions 112 of the lowermost nanosheet. The second inner spacers 122 (i.e., the upper inner spacers) are between end portions 112 of adjacent nanosheets and on opposing sides of a corresponding second internal portion 162 (i.e., a corresponding upper internal portion) of the gate 164.

Each of the inner spacers 120 (including the first inner spacers 121 and the second inner spacers 122) can have essentially the same overall length 117 as the gate sidewall spacers 165 and the end portions 112 of the nanosheets 110. Furthermore, due to the tapered shape of the end portions 112 of each nanosheet 110 and the fact that the inner spacers 120 are aligned below those end portions 112, each inner spacer 120 can also be tapered. That is, each inner spacer 120 can have a maximum spacer thickness 124 at the gate 164 and can taper down to a minimum spacer thickness 125 near the adjacent source/drain region 115. In exemplary embodiments, the maximum spacer thickness 124 can be 14-18 nm (e.g., 16 nm) and the minimum spacer thickness 125 can be 3-5 nm (e.g., 4 nm).

Each inner spacer 120 can include a first spacer layer 141, a second spacer layer 142a and, in the case of the second inner spacers 122 (i.e., in all but the first/lowermost inner spacers 121), a third spacer layer 142b.

Specifically, the first spacer layer 141 of each inner spacer 120, which is positioned laterally between a corresponding internal portion 160 of the gate 164 and an adjacent source/drain region, can have a uniform thickness 145 as measured in the first direction (i.e., perpendicular to the substrate). The thickness 145 of the first spacer layer 141 can be, for example, 2-6 nm (e.g., 4 nm). The first spacer layer 141 can be positioned laterally between and in contact with the sidewall of the corresponding internal portion 160 of the gate 164 and the sidewall of the adjacent source/drain region 115. Thus, the first spacer layer 141 can have essentially the same length 117 in the second direction (i.e., parallel to the substrate and oriented along the length of the device) as the gate sidewall spacers 165 and end portions 112 of the nanosheets 110. The first spacer layer 141 can further extend laterally across the full width of the device in the third direction (i.e., parallel to the substrate and oriented perpendicular to the second direction).

The second spacer layer 142a of each inner spacer 120, which is positioned laterally between a corresponding internal portion 160 of the gate 164 and an adjacent source/drain region 115, can have a non-uniform width, can extend vertically between and be in contact with the planar top surface of the first spacer layer 141 and the non-planar bottom surface of a tapered end portion 112 of the nanosheet 110 directly above, and can also be positioned laterally immediately adjacent to the sidewall of the internal portion 160 of the gate 164.

As mentioned above, only the second inner spacers 122 (i.e., upper inner spacers), which are on opposing sides of corresponding second internal portions 162 (i.e., upper internal portions) of the gate 164 include third spacer layers 142b. In each second inner spacer 122, which is positioned laterally between a corresponding second internal portion 162 of the gate 164 and an adjacent source/drain region 115, the third spacer layer 142b can extend vertically between and be in contact with the planar bottom surface of the first spacer layer 141 and the non-planar top surface of a tapered end portion 112 of the nanosheet 110 directly below, and can also be positioned laterally immediately adjacent to the sidewall of the corresponding second internal portion 162 of the gate 164.

Referring to FIGS. 1A-1E, in one specific embodiment of the GAAFET 100, within each inner spacer 120, the second spacer layer 142a can be shorter in length than the first spacer layer 141 as measured in the second direction (which is parallel to the substrate and oriented along the length of the device) and can be physically separated from the adjacent source/drain region 115 by the tapered end portion 112 of the nanosheet 110 directly above. Similarly, the third spacer layer 142b (which as mentioned above is only in the second inner spacers 122) can be shorter in length than the first spacer layer 141 and can be physically separated from the adjacent source/drain region 115 by a tapered end portion 112 of the nanosheet 110 directly below. Thus, in this specific embodiment, the uniform thickness 145 of the first spacer layer 141 is equal to the minimum spacer thickness 125.

Referring to FIGS. 2A-2D and FIG. 3 in other embodiments of the GAAFET 100', 100' within each inner spacer 120, the second spacer layer 142a can have essentially the same length 117 as the first spacer layer 141 and, like the first spacer layer 141, can be positioned laterally between and in contact with the sidewall of the corresponding internal portion 160 of the gate 164 and the sidewall of the adjacent source/drain region 115. Similarly, the third spacer layer 142b (which as mentioned above is only in the second inner spacers 122) can have essentially the same length 117 as the first spacer layer 141 and the second spacer layer 142a and can be positioned laterally between and in contact with the sidewall of the corresponding internal portion 160 of the gate 164 and the sidewall of the adjacent source/drain region 115. Thus, in this specific embodiment, the uniform thickness 145 of the first spacer layer 141 is less than the minimum spacer thickness 125.

Referring to FIGS. 1A-1E and FIGS. 2A-2D in some embodiments of the GAAFET 100, 100', within each of the inner spacers 120, the second spacer layer 142a can be a solid spacer layer that completely fills the space between the planar top surface of the first spacer layer 141 and the non-planar bottom surface of the tapered end portion of the nanosheet directly above. Similarly, within those second inner spacers 122 that also include a third spacer layer 142b, the third spacer layer 142b can be a solid spacer layer that completely fills the space between the planar bottom surface of the first spacer layer 141 and the non-planar top surface of the tapered end portion of the nanosheet directly below.

Referring to FIG. 3, in other embodiments of the GAAFET 100", within each of the inner spacers 120, the second spacer layer 142a can include an air-gap 180. Similarly, within those second inner spacers 122 that also include a third spacer layer 142b, the third spacer layer 142b can include an air-gap 180. In other words, the inner spacers 120 can be air-gap inner spacers.

It should, however, be understood that the figures are not intended to be limiting and that other GAAFET embodiments are anticipated, given possible variations in the dimensions of the inner spacer cavities and/or possible variations in the thickness of the conformally deposited dielectric spacer material. For example, the GAAFET 100 could similarly include air-gaps in the second and third spacer layers 142a-142b; the second and third spacer layers 142a-142b could completely encapsulate the air-gaps 180 (as illustrated); the air-gaps 180 could physically separate the second and third spacer layers 142a-142b from the source/drain regions; etc.

Referring again to FIGS. 1A-1E, 2A-2D and 3, during processing to form the GAAFET 100, 100', 100", a first dielectric spacer material can be used to form the first spacer layer 141 of each inner spacer 120 and a second dielectric spacer material can be used to form the second spacer layer 142a and, if present, the third spacer layer 142b of each inner spacer 120. The first dielectric spacer material and the second dielectric spacer material can be the same dielectric spacer material or different dielectric spacer materials.

For example, the first dielectric spacer material and the second dielectric spacer material could both be silicon nitride (SiN). Alternatively, the first dielectric spacer material could be silicon nitride (SiN) and the second dielectric spacer material could be some low-K dielectric material. Regardless of whether the first dielectric spacer material and the second dielectric spacer material are the same or different, they should be different from the dielectric materials of the interlayer dielectric (ILD) layer(s), the gate sidewall spacers 165, and the isolation layer 105 so that they can be selectively etched during processing, as discussed in further detail below with regard to the method embodiments. Thus, for example, if the ILD material is silicon dioxide ($SiO_2$) and the isolation layer 105 and gate sidewall spacers 165 are made of silicon boron carbonitride (SiBCN), silicon oxycarbonitride (SiOCN), or silicon carbonitride (SiCN), then the first dielectric spacer material of the first spacer layer 141 could be silicon nitride (SiN) and the second dielectric spacer material of the second spacer layer 142a and third spacer layer 142b (if present) could be silicon oxycarbide (SiOC). It should be understood that the exemplary combination of materials mentioned above is not intended to be limiting and that alternative combinations could be employed. For example, if the ILD material is silicon dioxide ($SiO_2$) and the isolation layer 105 and gate sidewall spacers 165 are made of silicon boron carbonitride (SiBCN), then the first dielectric spacer material of the first spacer layer 141 could be silicon nitride (SiN) and the second dielectric spacer material of the second spacer layer 142a and the third spacer layer 142b (if present) could be silicon oxycarbide (SiOC), silicon oxycarbonitride (SiOCN), or silicon carbonitride (SiCN) and so on.

In addition to the features described above, the semiconductor structure can further include, for example: metal plugs 198 on the source/drain regions 115; one or more middle of the line (MOL) dielectric layers (e.g., an etch stop layer, an ILD layer, etc.) (not shown) over the GAAFET(s) 100, 100', 100"; and one or more contacts (also not shown) extending vertically through the MOL dielectric layer(s) to the GAAFET(s) 100, 100', 100". Such features are well known in the art and, thus, the details thereof have been omitted from this specification in order to allow the reader to focus on the salient aspects of the disclosed embodiments.

Figure 4:
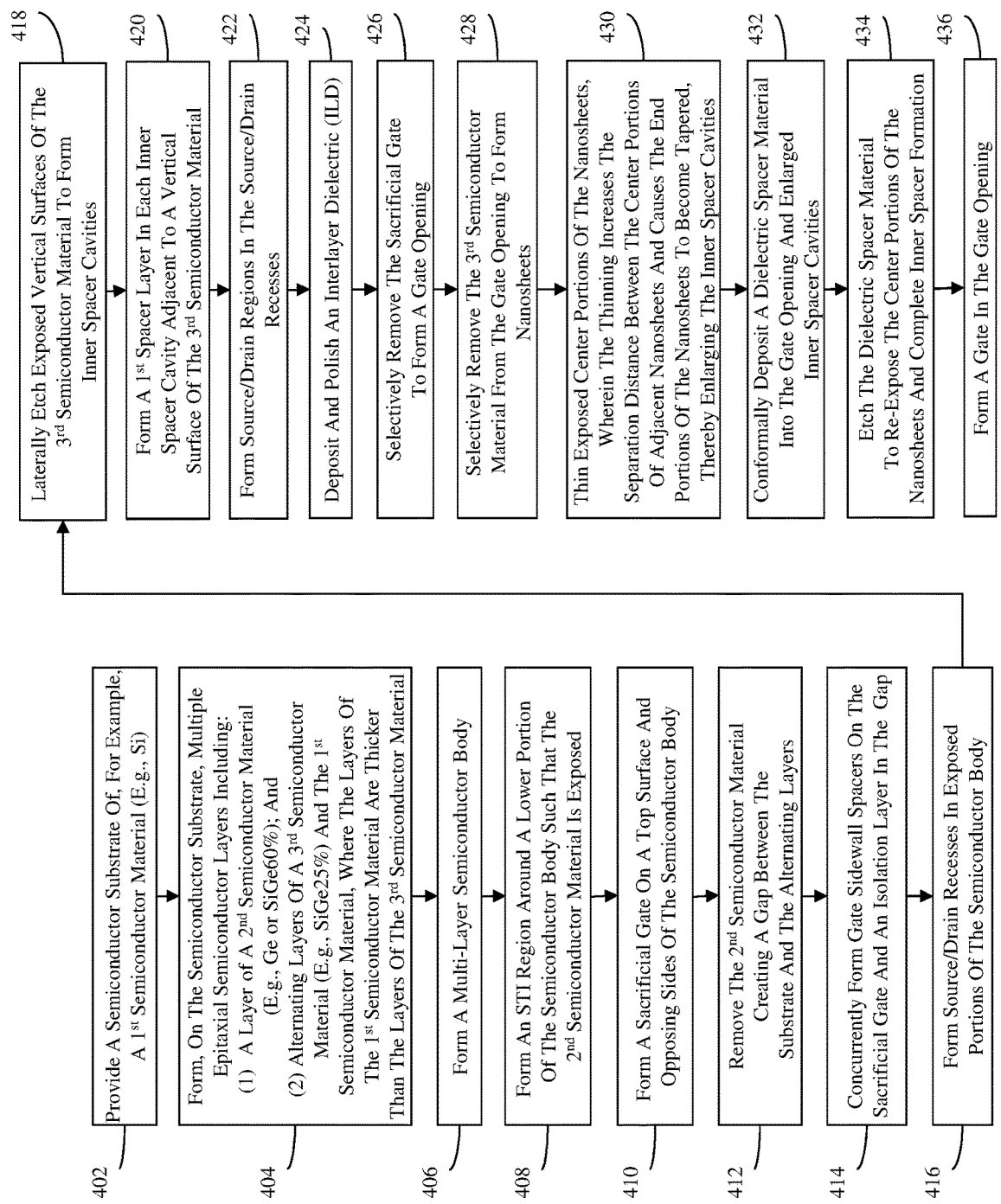
FIG. 4 is a flow diagram illustrating method embodiments for forming a semiconductor structure that includes a GAAFET with robust inner spacers.

Referring to the flow diagram of FIG. 4, also disclosed herein are embodiments of a method for forming a semiconductor structure that includes at least one nanosheet-type gate-all-around field effect transistor (GAAFET) with robust inner spacers, such as the GAAFET 100 described above and illustrated in FIGS. 1A-1E, the GAAFET 100' described above and illustrated in FIGS. 2A-2D or the GAAFET 100" described above and illustrated in FIG. 3.

Figures 5A, 5B:
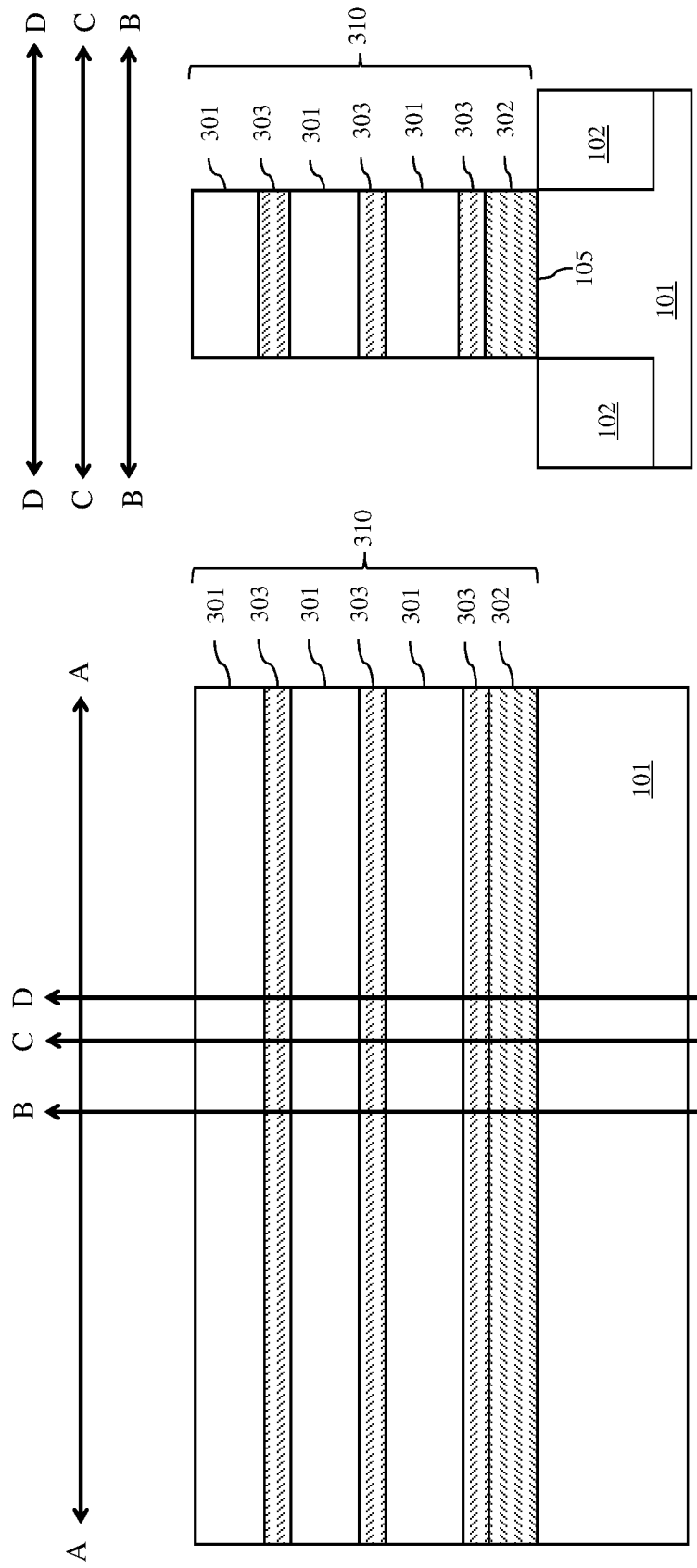
FIGS. 5A-5B are different cross-section diagrams illustrating a partially completed structure formed according to the flow diagram of FIG. 4.

The method can begin with a semiconductor substrate 101 (see process step 402 and FIGS. 5A-5B). The semiconductor substrate 101 can be a bulk semiconductor wafer. The bulk semiconductor wafer can be made, for example, of a first semiconductor material 301 (e.g., monocrystalline silicon) or some other suitable monocrystalline semiconductor material.

Multiple monocrystalline semiconductor layers can then be formed on the top surface of the semiconductor substrate 101 (see process step 404 and FIGS. 5A-5B). These semiconductor layers can be formed, for example, by epitaxial deposition and can include an initial layer of a second semiconductor material 302 and alternating layers of a third semiconductor material 303 and the first semiconductor material 301. For example, in one exemplary embodiment, the first semiconductor material 301 can be monocrystalline silicon (Si), the second semiconductor material 302 can be either monocrystalline germanium (Ge) or monocrystalline silicon germanium (SiGe) with a relatively high percentage of germanium (e.g., SiGe 60%), and the third semiconductor material can be monocrystalline silicon germanium with a relatively low percentage of germanium and, particularly, a lower percentage of germanium than in the second semiconductor material (e.g., SiGe 25%). In any case, the second semiconductor material 302 can be preselected so that it can be selectively etched over the first semiconductor material 301 and the third semiconductor material 303 (i.e., so that it can be selectively removed during subsequent processing). Similarly, the third semiconductor material 303 can be preselected so that it can be selectively etched over the first semiconductor material 301 (i.e., so it can be selectively removed during subsequent processing).

As illustrated, the layers of the third semiconductor material 303 can be relatively thin as compared to the layers of the first semiconductor material 301 and the layer of the second semiconductor material 302. Additionally, the layer of the second semiconductor material 302 can be relatively thin as compared to the layers of the first semiconductor material 301. In exemplary embodiments, the layers of the first semiconductor material 301 can each have a thickness of 11-15 nm (e.g., 13 nm), the layers of the third semiconductor material 303 can have a thickness of 3-5 nm (e.g., 4 nm) and the layer of the second semiconductor material can have a thickness of 8-12 nm (e.g., 10 nm).

It should be noted that the layers of the first semiconductor material will be used during subsequent processing to form nanosheets, which will have center portions that function as channel regions and end portions that function as source/drain extension regions. Thus, the layers of the first semiconductor material 301 can be either intrinsic (i.e., undoped) or in situ doped during epitaxial deposition so as to have the desired conductivity type and level for the channel regions. Those skilled in the art will recognize that the conductivity type will vary depending upon the conductivity type of the GAAFET being formed. For example, for a P-type GAAFET, the channel regions will be either intrinsic (i.e., undoped) or doped so as to have N-type conductivity at a relatively low conductivity level (i.e., N− conductivity). For an N-type GAAFET, the channel regions will be either intrinsic (i.e., undoped) or doped so as to have P-type conductivity at a relatively low conductivity level (i.e., P− conductivity). As discussed in greater detail below, doping of the source/drain extension regions is performed during subsequent processing.

A multi-layer semiconductor body 310 (e.g., an essentially rectangular-shaped body or fin-shaped body) can then be formed from this partially completed structure (see process step 406 and FIGS. 5A-5B). The semiconductor body 310 can be formed, for example, using conventional lithographic patterning and etch processes, sidewall image transfer processes, etc. It should be noted that the semiconductor body 310 should be formed at process step 406 by etching through each of the semiconductor layers and into an upper portion of the semiconductor substrate 101 such that trenches are formed in the top surface of the semiconductor substrate 101.

Next, an isolation region 102 (e.g., a shallow trench isolation (STI) region) can be formed within the trenches (see process step 408 and FIGS. 5A-5B). Specifically, an isolation material (e.g., silicon dioxide ($SiO_2$)) can be deposited and etched back such that the layer of the second semiconductor material 302 is exposed.

Figure 6A:
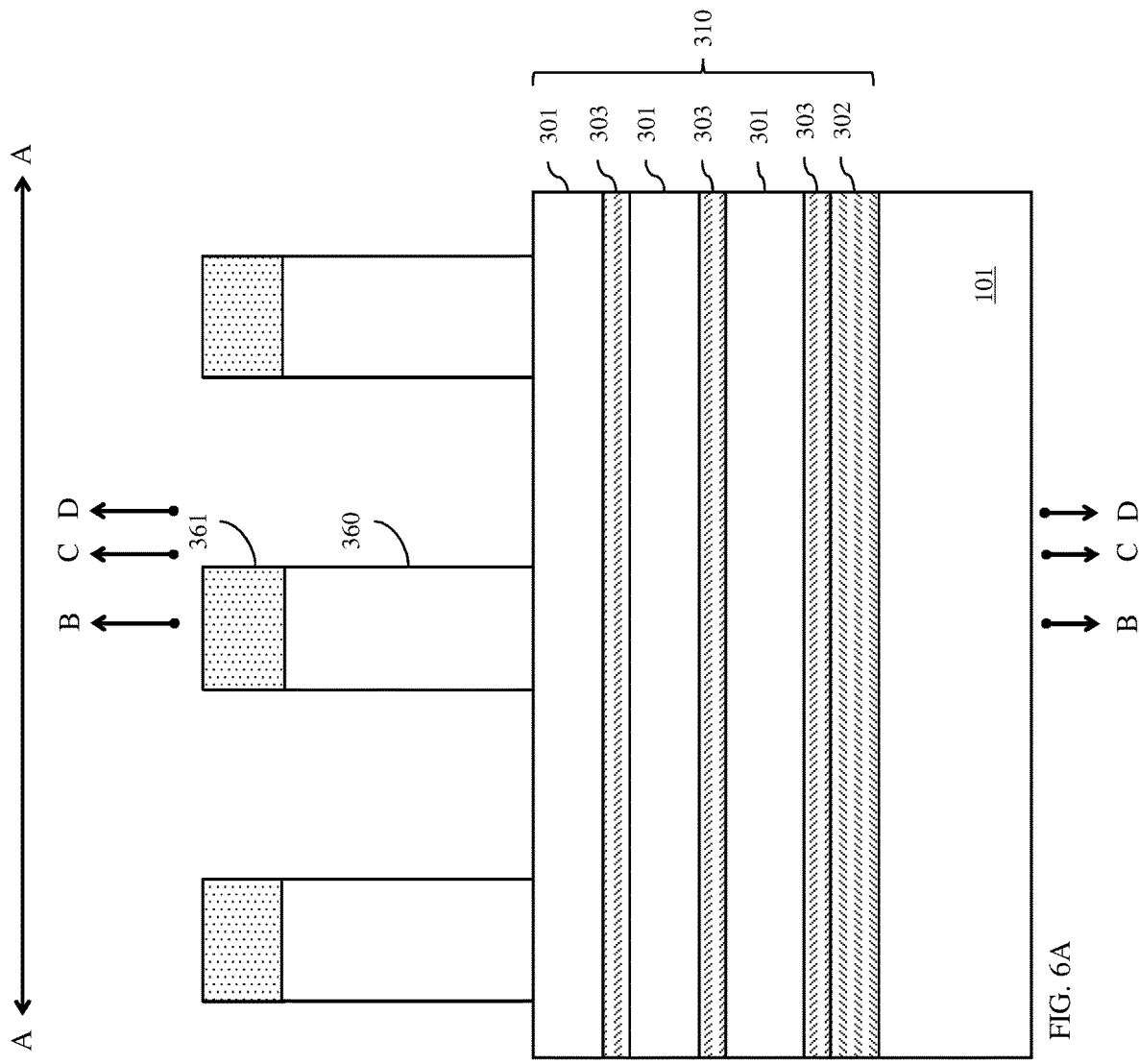

Following STI formation, a sacrificial gate 360 with a sacrificial gate cap 361 can be formed adjacent to the top surface and opposing sides of the semiconductor body 310 (see process step 410 and FIGS. 6A-6C). For example, a thin conformal dielectric layer (e.g., a thin silicon dioxide layer (not shown)) can be deposited over the partially completed structure. Then, a blanket sacrificial gate layer can be deposited onto the conformal dielectric layer. This blanket sacrificial gate layer can be, for example, a polysilicon layer, an amorphous silicon layer or any other suitable sacrificial gate material that is different from the materials of the semiconductor body 310 (e.g., different from the first semiconductor material, the second semiconductor material, and the third semiconductor material) and that can be selectively and isotropically etched away from these materials during subsequent processing. The sacrificial gate layer can then be polished (e.g., using a CMP process) and a sacrificial dielectric cap layer (e.g., a silicon nitride (SiN) cap layer) can be deposited onto the sacrificial gate layer. The resulting sacrificial gate stack can then be lithographically patterned and etched to form the sacrificial gate 360 with the sacrificial gate cap 361. It should be noted that process step 410 can be performed such that the resulting sacrificial gate is on a first portion and, particularly, a designated channel portion of the semiconductor body 310 and such that second portions and, particularly, designated source/drain portions extend laterally beyond the sacrificial gate 360.

Figure 7A:
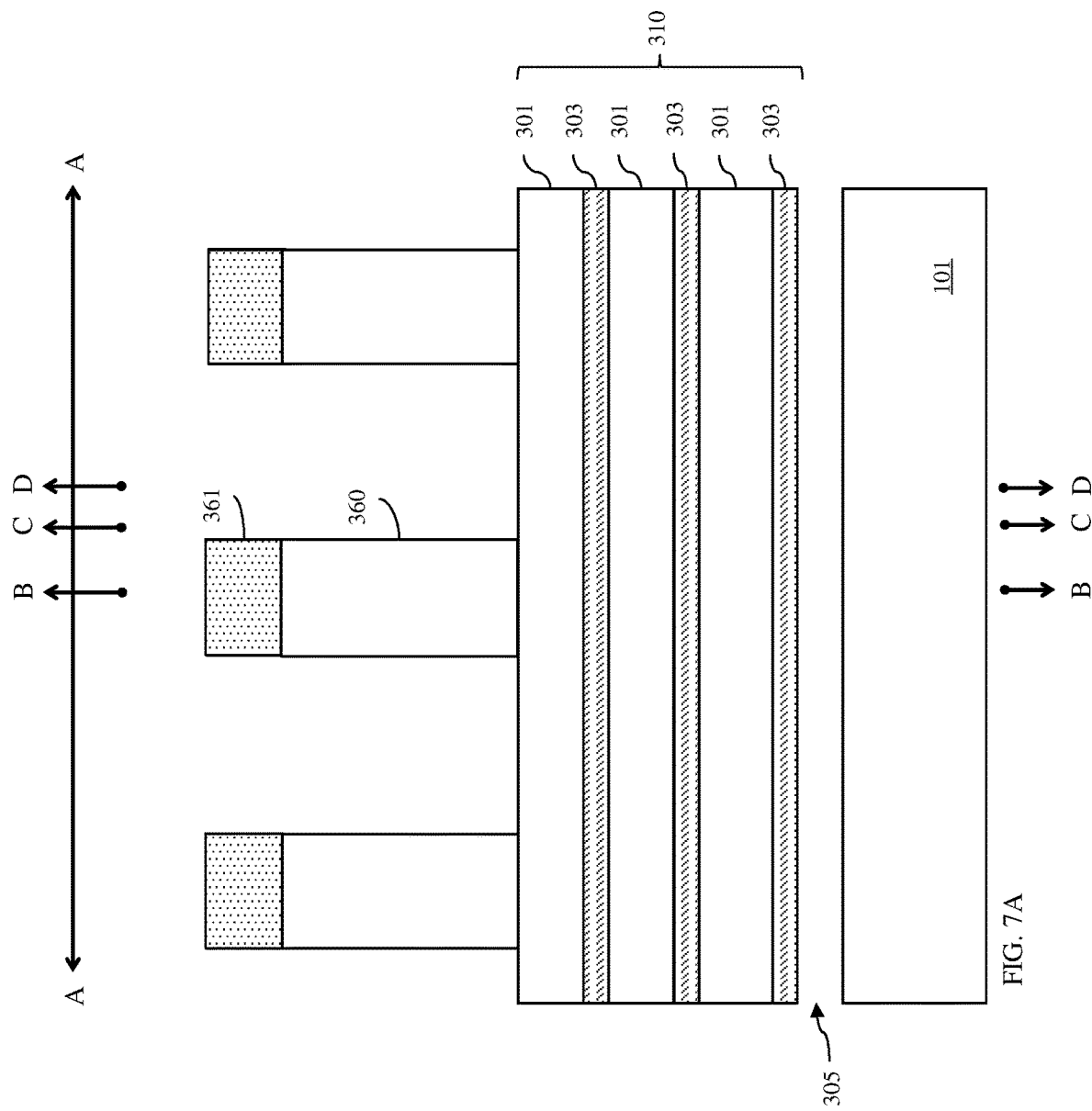

The layer of second semiconductor material 302 can then be selectively removed from the semiconductor body 310, including from the first portion of the semiconductor body 310 under the sacrificial gate 360, in order to form a gap 305 (i.e., a buried insulator cavity) between the top surface of the semiconductor substrate 101 and the alternating layers of the third semiconductor material 303 and the first semiconductor material 301 above (see process step 412 and FIGS. 7A-7C). Specifically, an isotropic etch process that is selective for the second semiconductor material 302 over the first semiconductor material 301, over the third semiconductor material 303, over the sacrificial materials of the sacrificial gate 360 and the sacrificial gate cap 361 thereon, and over the isolation material of the STI regions 102 can be performed in order to completely remove the second semiconductor material 302, leaving the other above-mentioned materials essentially intact and creating the gap 305. For example, as mentioned above in an embodiment disclosed herein, the first semiconductor material 301 can be Si, the second semiconductor material 302 can be SiGe60%, the third semiconductor material can be SiGe25%, the sacrificial gate 360 can be poly or amorphous Si, the sacrificial gate cap can be SiN, and the isolation material of the STI regions 102 can be $SiO_2$. In this case, the SiGe60% can be selectively removed, for example, using a hydrogen chloride (HCl) or chlorine trifluoride (ClF$_3$) vapor phase etch process.

Figure 8A:
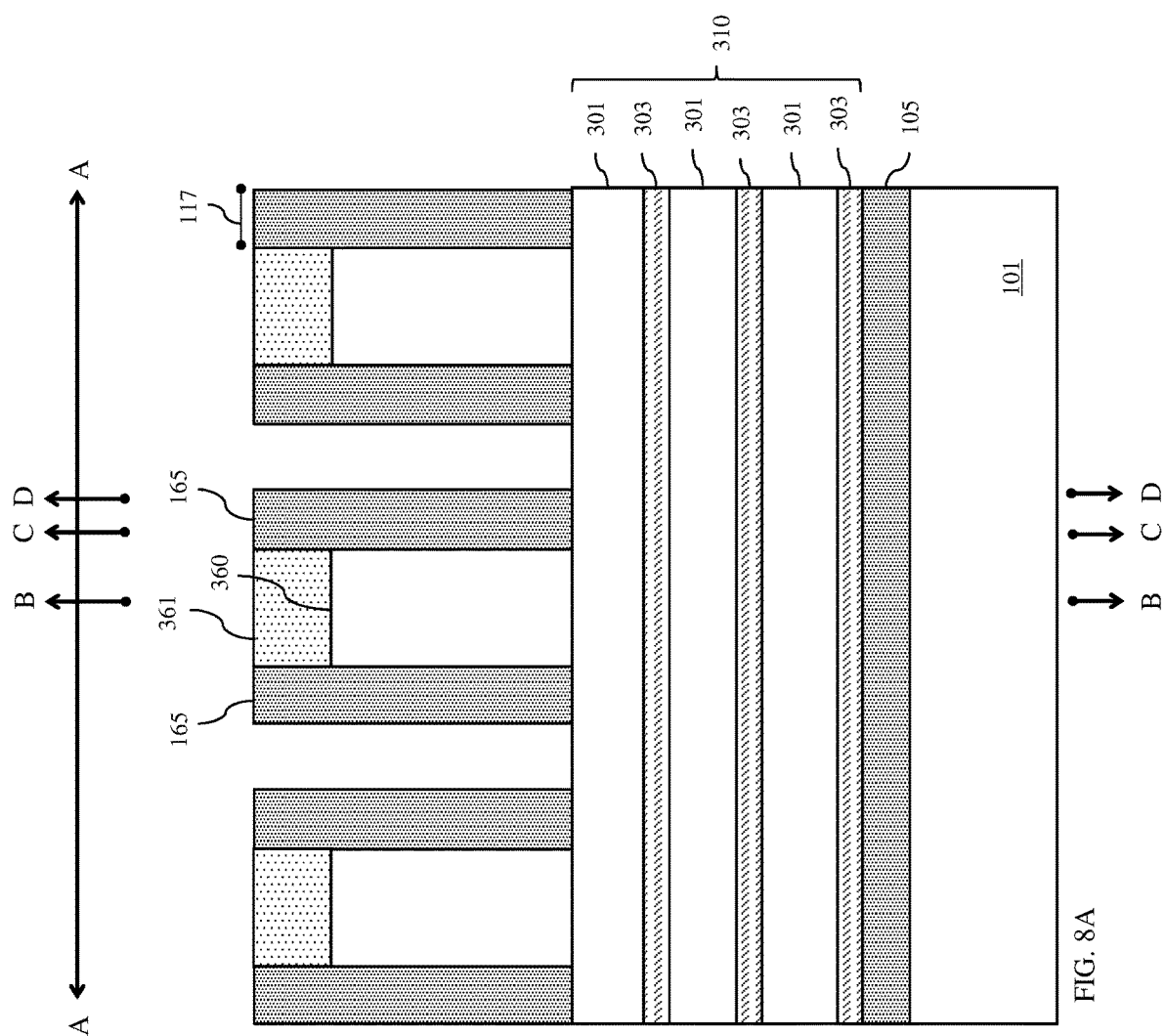
FIGS. 8A-8C are different cross-section diagrams illustrating a partially completed structure formed according to the flow diagram of FIG. 4.
Figure 8C:
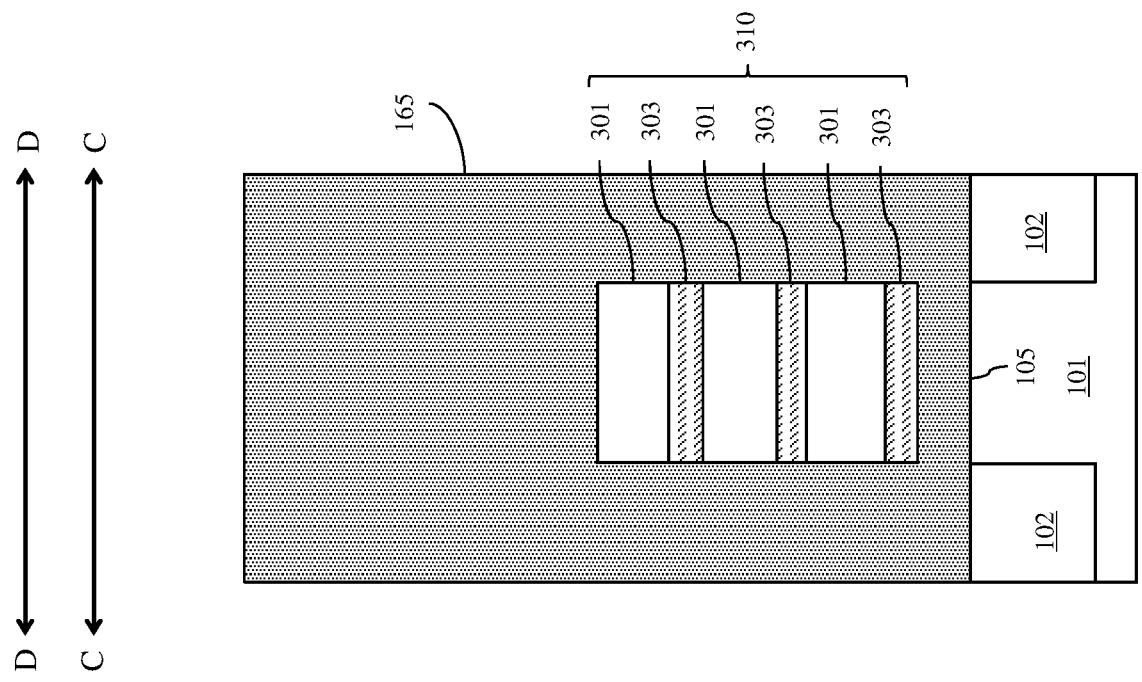
Figure 8B:
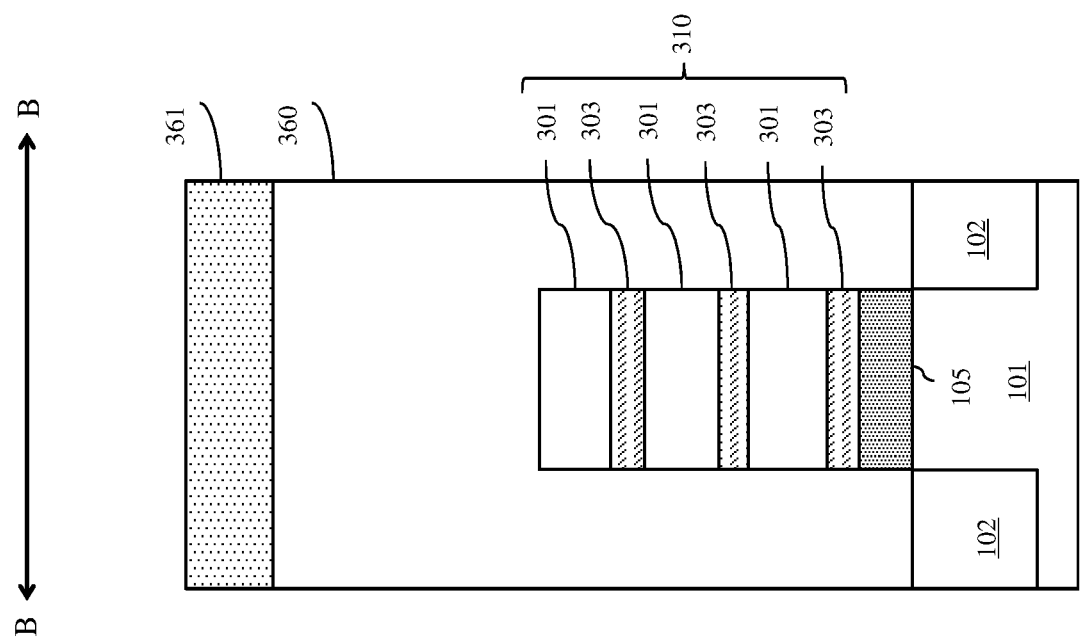

After the second semiconductor material 302 is selectively removed, gate sidewall spacers 165 can be formed adjacent to external sidewalls of the sacrificial gate 360 and, concurrently, an isolation layer 105 can be formed in the gap 305 (see process step 414 and FIGS. 8A-8C). Specifically, a gate sidewall spacer/isolation material can be conformally deposited over the partially completed structure and into the gap 305. Then an anisotropic etch process can be performed to remove exposed horizontal portions of this material. The remaining vertical portions on the sidewalls of the sacrificial gate 360 will form the gate sidewall spacers 165. Additionally, the unexposed horizontal portions within the gap 305 will form an isolation layer 105. The gate sidewall spacer/isolation material can be, for example, a low-K dielectric material. For purposes of this disclosure, a low-K dielectric material refers to a dielectric material having a dielectric constant (K) that is less than the dielectric constant of silicon dioxide (SiO$_2$) (i.e., K<3.9). Thus, for example, the gate sidewall spacer/isolation material can be silicon boron carbonitride (SiBCN), silicon oxycarbonitride (SiOCN), silicon carbonitride (SiCN) or any other suitable low-K dielectric material. It should be noted that the thickness of the conformally deposited layer of the gate sidewall spacer/isolation material can be such that the resulting gate sidewall spacers 165 have a desired length 117 (as measured in a direction parallel to the length of the semiconductor body 310).

Figure 9:
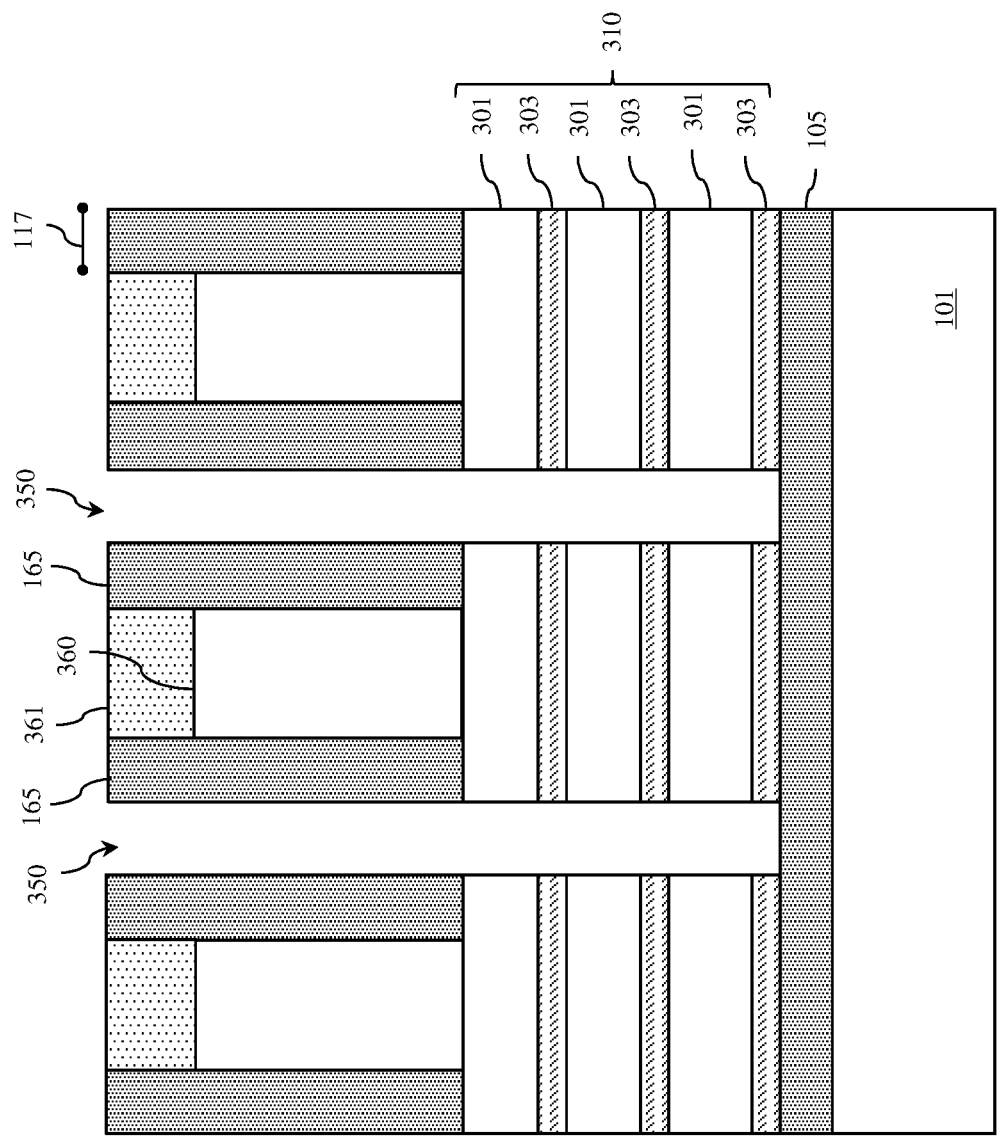
FIG. 9 is a cross-section diagram illustrating a partially completed structure formed according to the flow diagram of FIG. 4.

Source/drain recesses 350 can then be formed in the exposed second portions of the semiconductor body 310 (i.e., the portions of the semiconductor body 310 that extend laterally beyond the sacrificial gate 360 and gate sidewall spacers 165) (see process step 416 and FIG. 9). Specifically, an anisotropic etch process can be performed, wherein the etch chemistries used are selective for the first semiconductor material 301 and the third semiconductor material 303 of the semiconductor body 310 over the exposed dielectric materials of the gate sidewall spacer 165, the sacrificial gate cap 361, and the isolation layer 105. Thus, this etch process will completely remove the exposed portions of the semiconductor body 310 stopping on the isolation layer 105. Additionally, as a result of this etch process, essentially vertical surfaces of the remaining first portion of the semiconductor body 310 under the sacrificial gate 360 and gate sidewall spacers 165 will be exposed within each source/drain recess 350 and essentially vertically aligned with the outermost edge of the gate sidewall spacers 165.

Figure 10A:
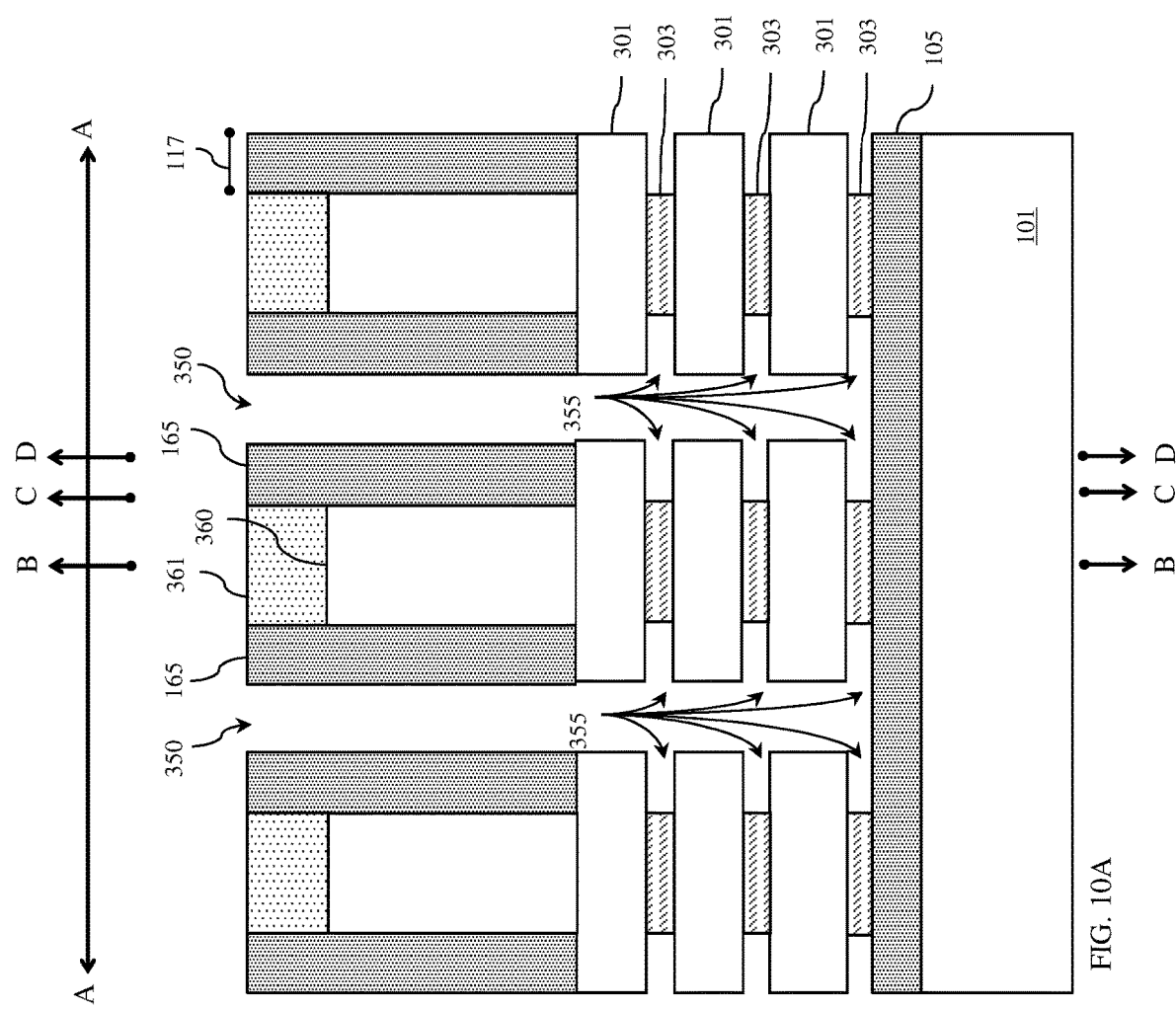
FIGS. 10A-10C are different cross-section diagrams illustrating a partially completed structure formed according to the flow diagram of FIG. 4.
Figure 10C:
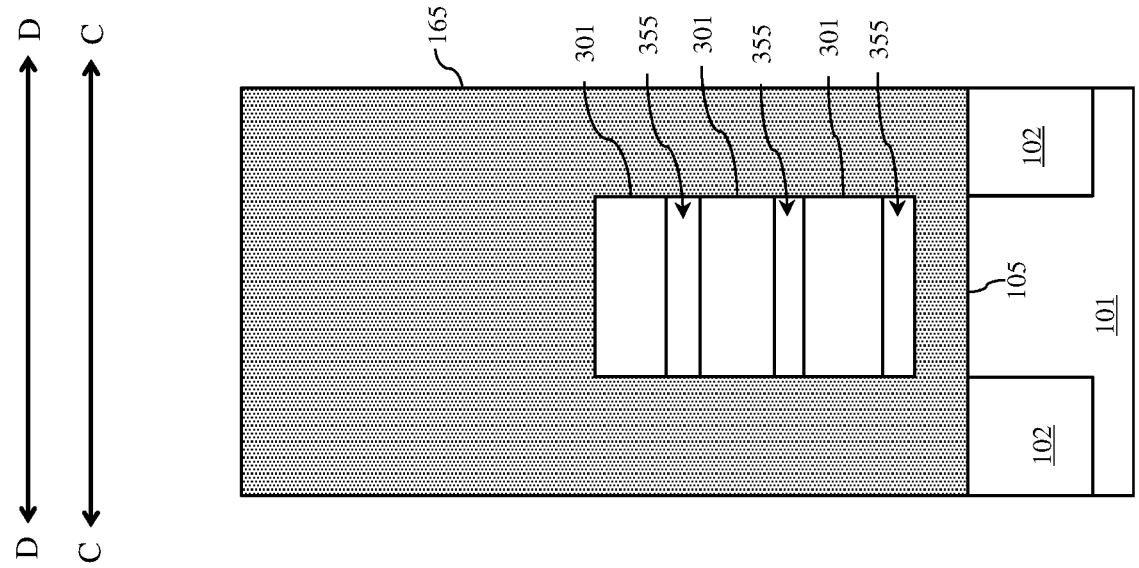
Figure 10B:
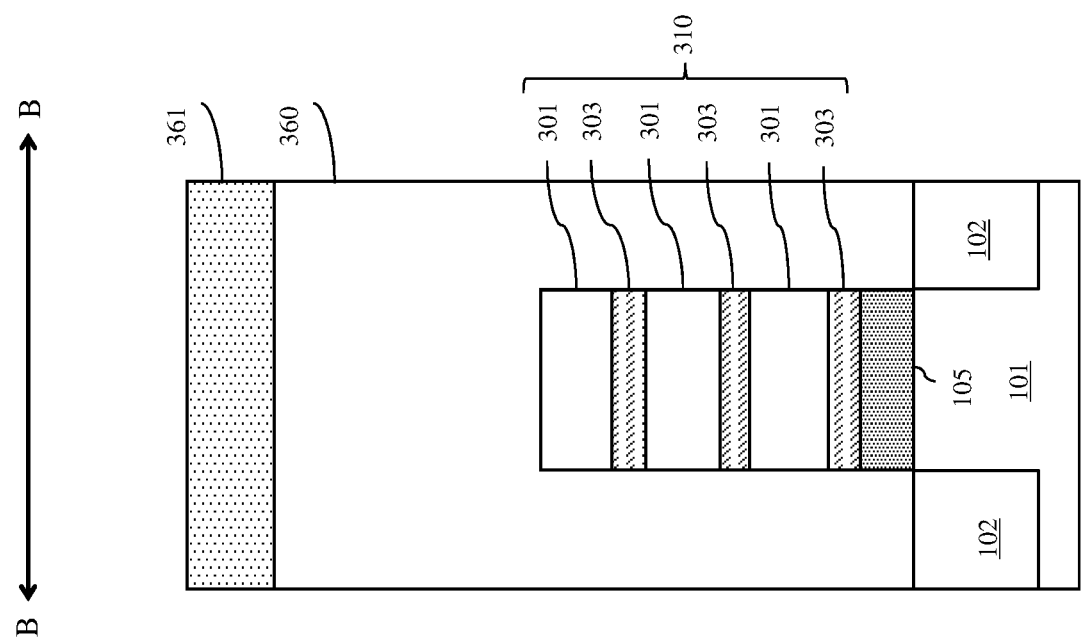

Then, third semiconductor material 303, which is exposed at these vertical surfaces, can be laterally etched to form inner spacer cavities 355 (see process step 418 and FIGS. 10A-10C). Specifically, the inner spacer cavities 355 can be formed in the sides of the source/drain recesses 350 adjacent to the sacrificial gate 360 using a selective isotropic etch process that is selective for the third semiconductor material 303 over the other exposed materials of the partially completed structure, thereby creating the inner spacer cavities 355. For example, in the exemplary embodiment where the first semiconductor material 301 is Si and the third semiconductor material is SiGe 25%, selective lateral etching of the third semiconductor material 303 can be accomplished using, for example, a chlorine trifluoride (ClF$_3$) vapor phase etch process or a wet etch process that employs a standard clean solution no. 1 (SC1) at an elevated temperature (e.g., approximately 40° C.). In any case, the etch process can specifically be timed such that the depth of the inner spacer cavities 355 is approximately equal to the length 117 of the gate sidewall spacers 165.

Figure 11A:
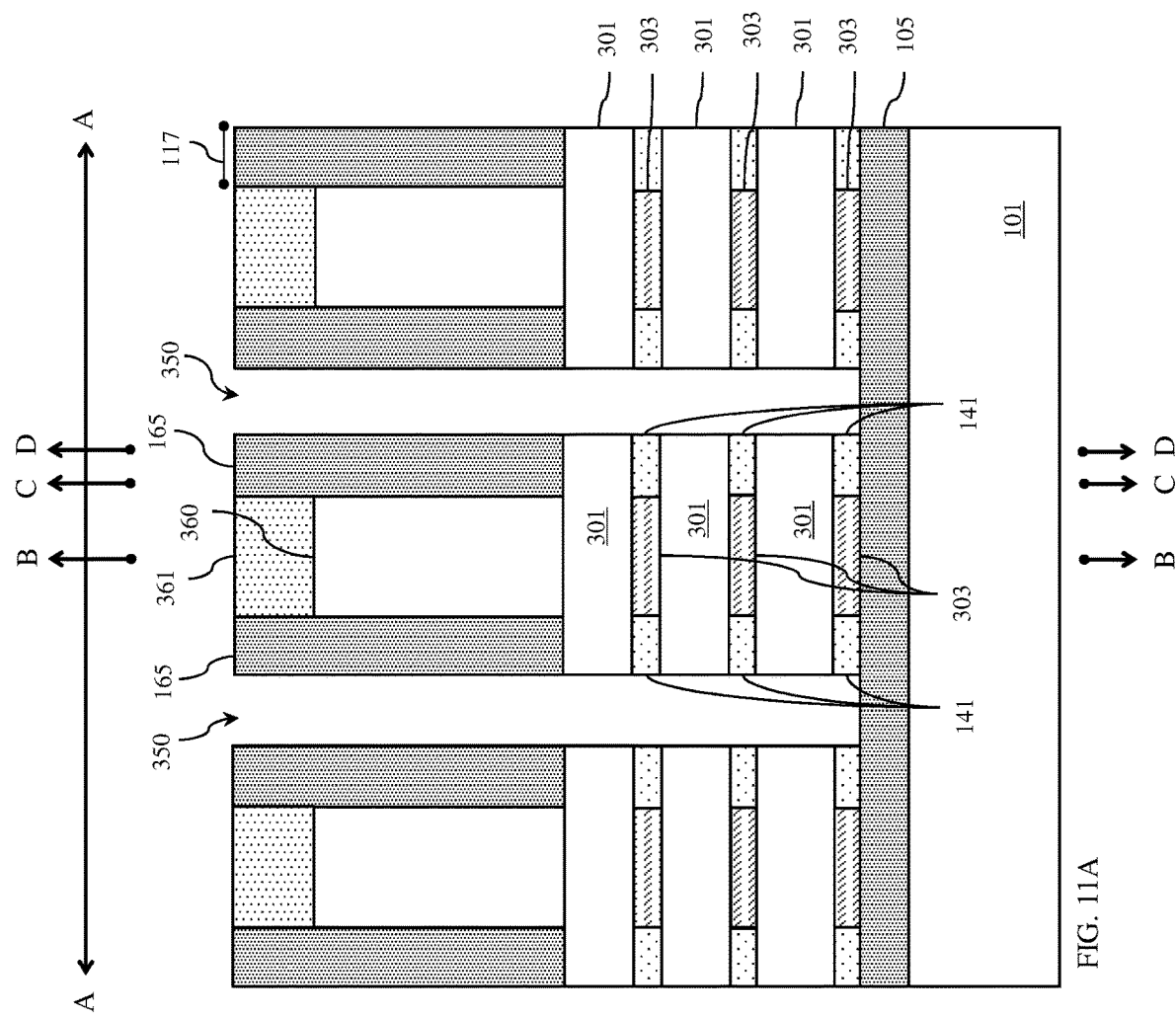
FIGS. 11A-11C are different cross-section diagrams illustrating a partially completed structure formed according to the flow diagram of FIG. 4.
Figure 11C:
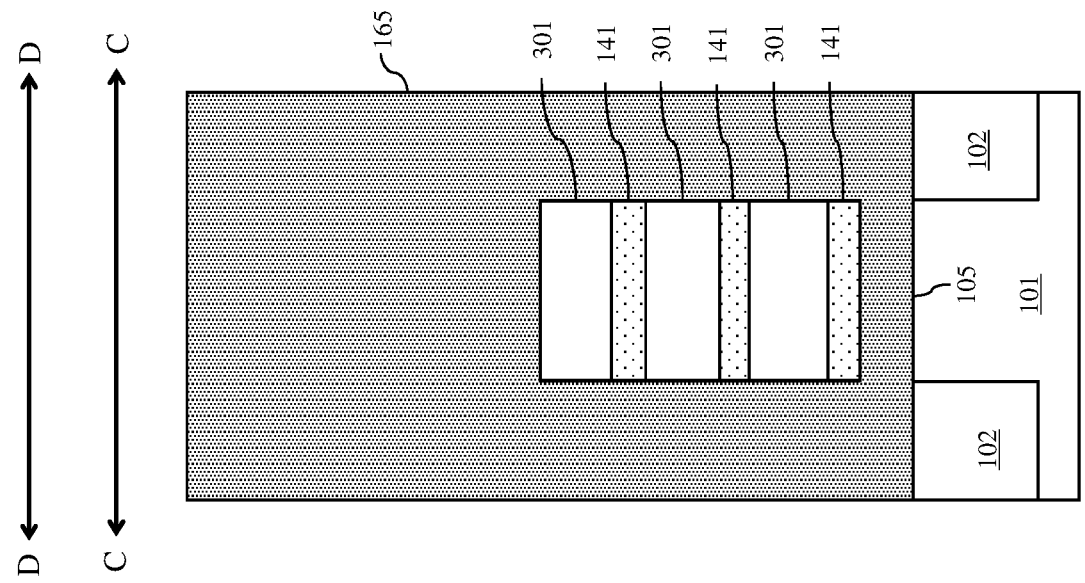
Figure 11B:
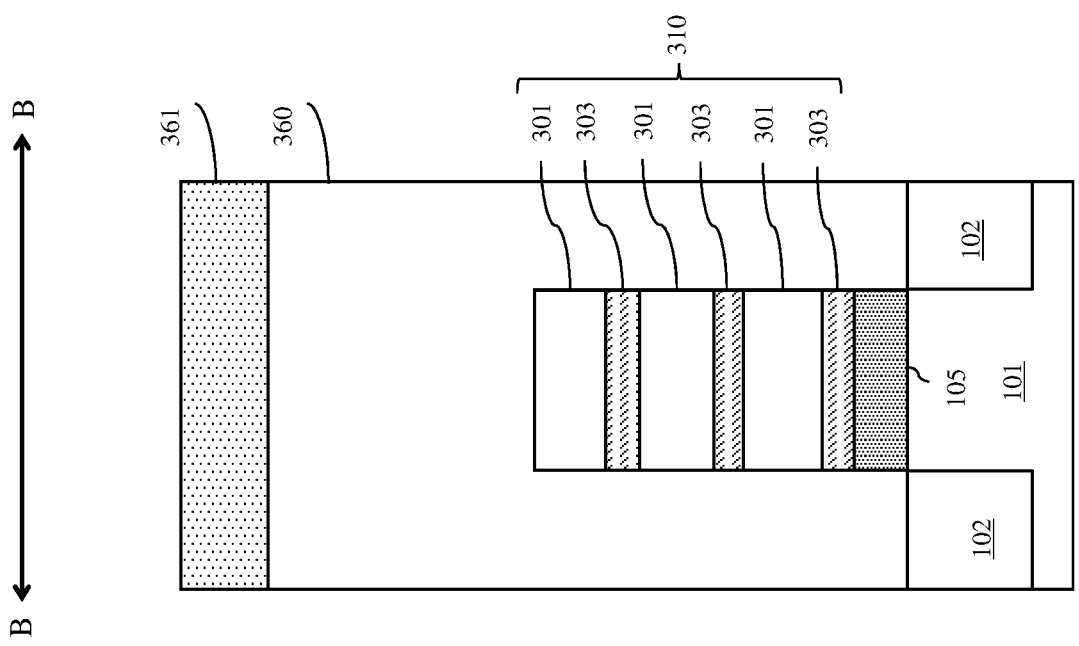

First spacer layers 141 for inner spacers can then be formed in these inner spacer cavities 355 (see process step 420 and FIGS. 11A-11C). Specifically, a layer of a first dielectric spacer material can be conformally deposited over the partially completed structure and specifically into the inner spacer cavities 355. The first dielectric spacer material can be, for example, silicon nitride (SiN). A selective isotropic etch process can then be performed to remove excess SiN outside the inner spacer cavities 355, thereby leaving a first spacer layer 141 within and filling each of the inner spacer cavity 355. It should be understood that the thickness of this first spacer layer 141 will be equal to the height of the inner spacer cavity 355, which, in turn, will be equal to thickness of the adjacent layer of the third semiconductor material 303.

Figure 12:
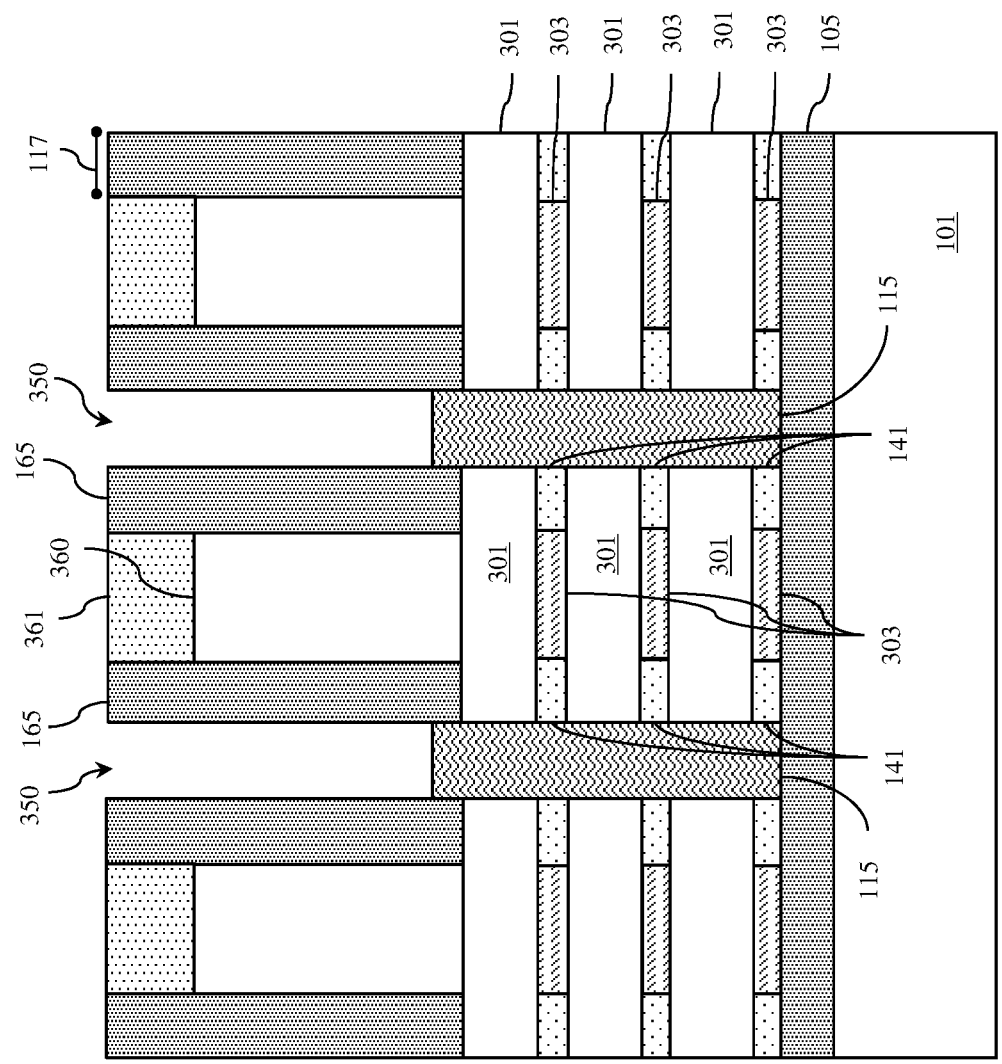
FIG. 12 is a cross-section diagram illustrating a partially completed structure formed according to the flow diagram of FIG. 4.

Source/drain regions 115 can subsequently be formed on the isolation layer 105 in the source/drain recesses 350 (see process step 422 and FIG. 12). The source/drain regions 115 can be formed, for example, by epitaxially growing a monocrystalline semiconductor material on the exposed vertical surfaces the first semiconductor material within the source/drain recesses 350. This semiconductor material for the source/drain regions can be the first semiconductor material (e.g., monocrystalline silicon (Si)) or some other suitable monocrystalline semiconductor material, which is preselected, for example, to improve channel mobility depending upon the conductivity type of GAAFET being formed. Additionally, the source/drain regions 115 can be in situ doped, during epitaxial deposition, so as to have a suitable conductivity type and level given the conductivity type of the GAAFET being formed. For example, for a P-type GAAFET, the source/drain regions 115 can be in situ doped so as to have P-type conductivity at a relatively high conductivity level (i.e., P+ conductivity). For an N-type GAAFET, the source/drain regions 115 can be in situ doped so as to have N-type conductivity at a relatively high conductivity level (i.e., N+ conductivity). Additionally, an anneal process can be performed so as to drive some of the dopant material from the source/drain regions 115 into the exposed ends of the layers of the first semiconductor material 301, thereby doping the source/drain extension regions. As a result, for a P-type GAAFET, the source/drain extensions regions will have P-type conductivity at a relatively low conductivity level (i.e., P– conductivity). For an N-type GAAFET, the source/drain extension regions will have N-type conductivity at a relatively low conductivity level (i.e., N– conductivity).

Figure 13:
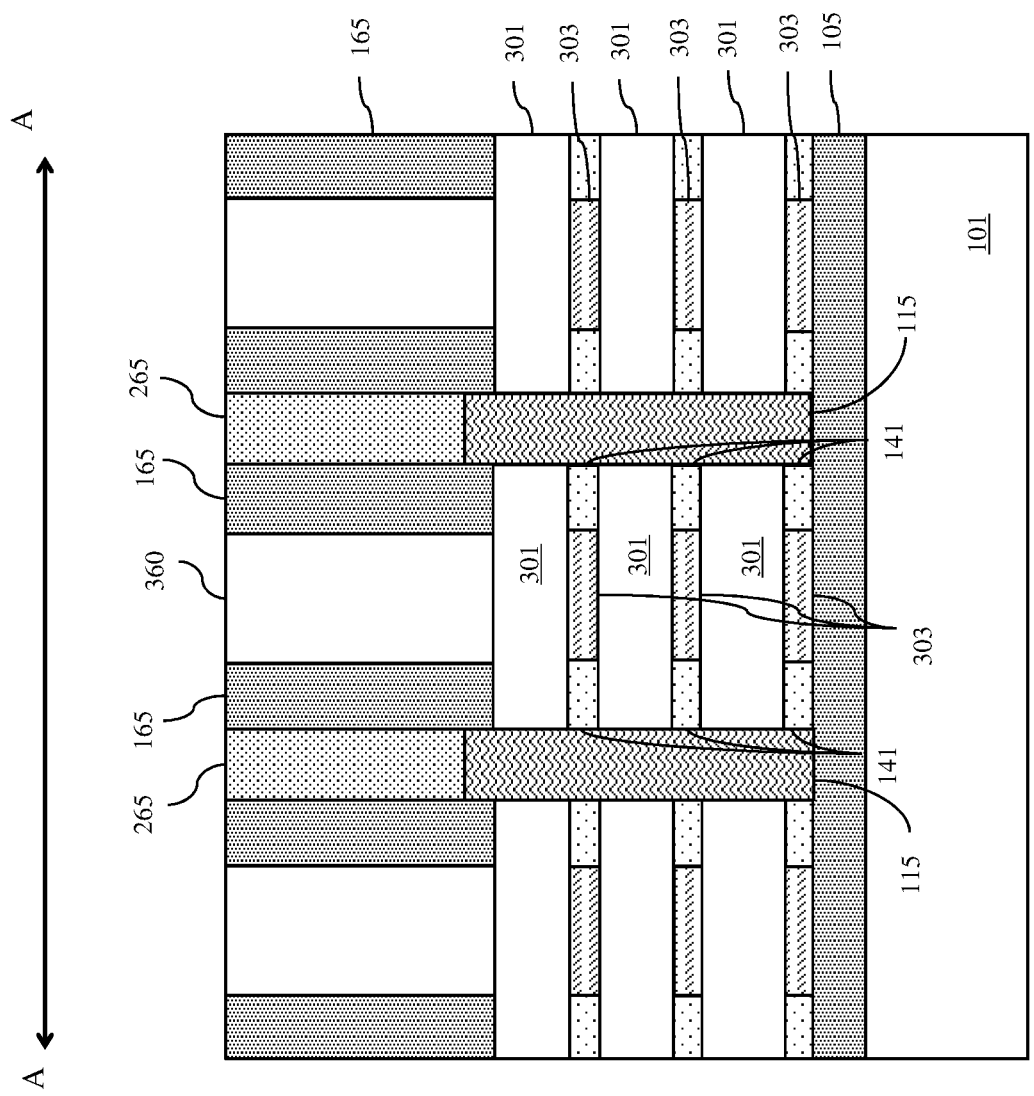
FIG. 13 is a cross-section diagram illustrating a partially completed structure formed according to the flow diagram of FIG. 4.
Figure 14A:
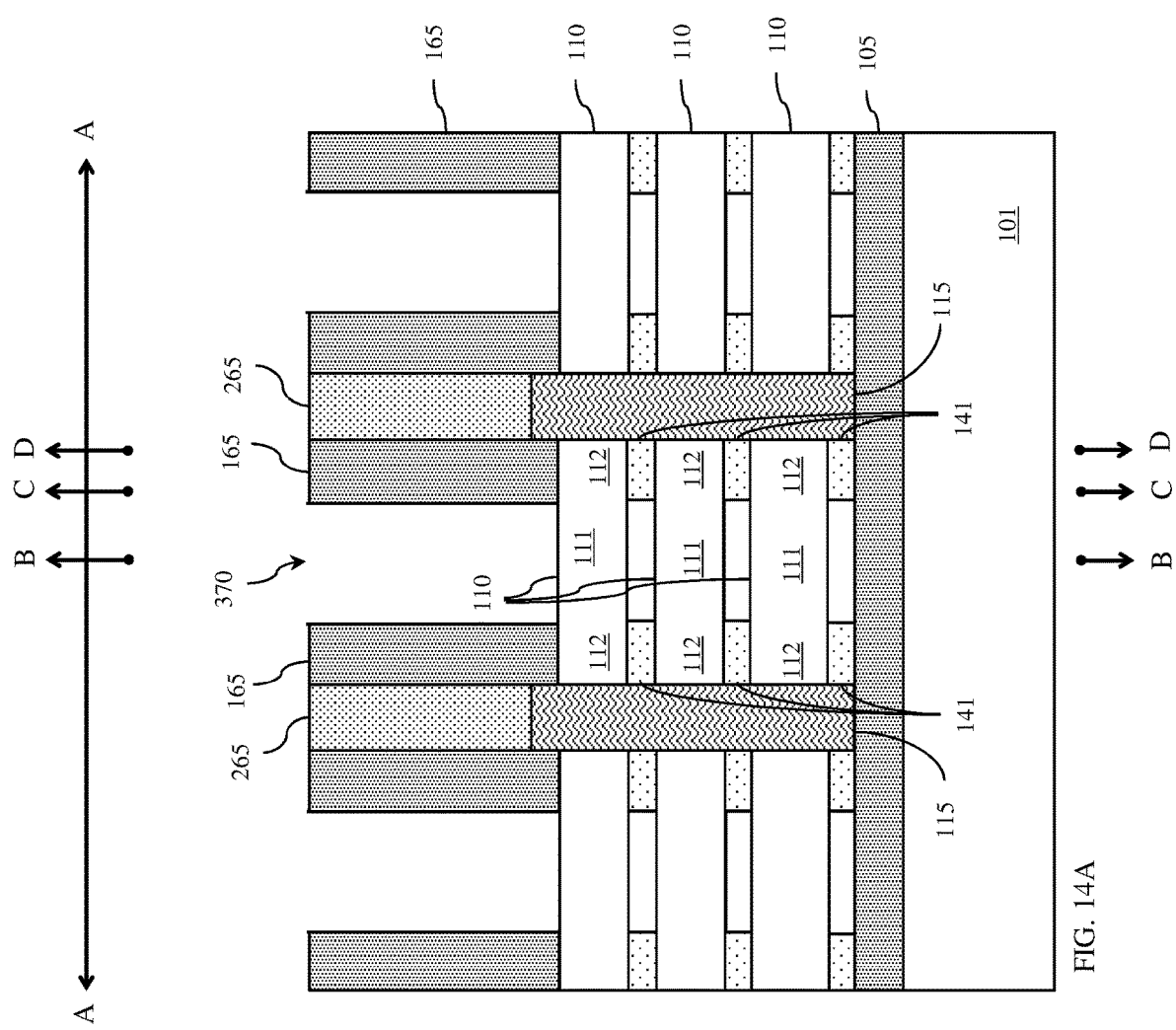
Figure 15A:
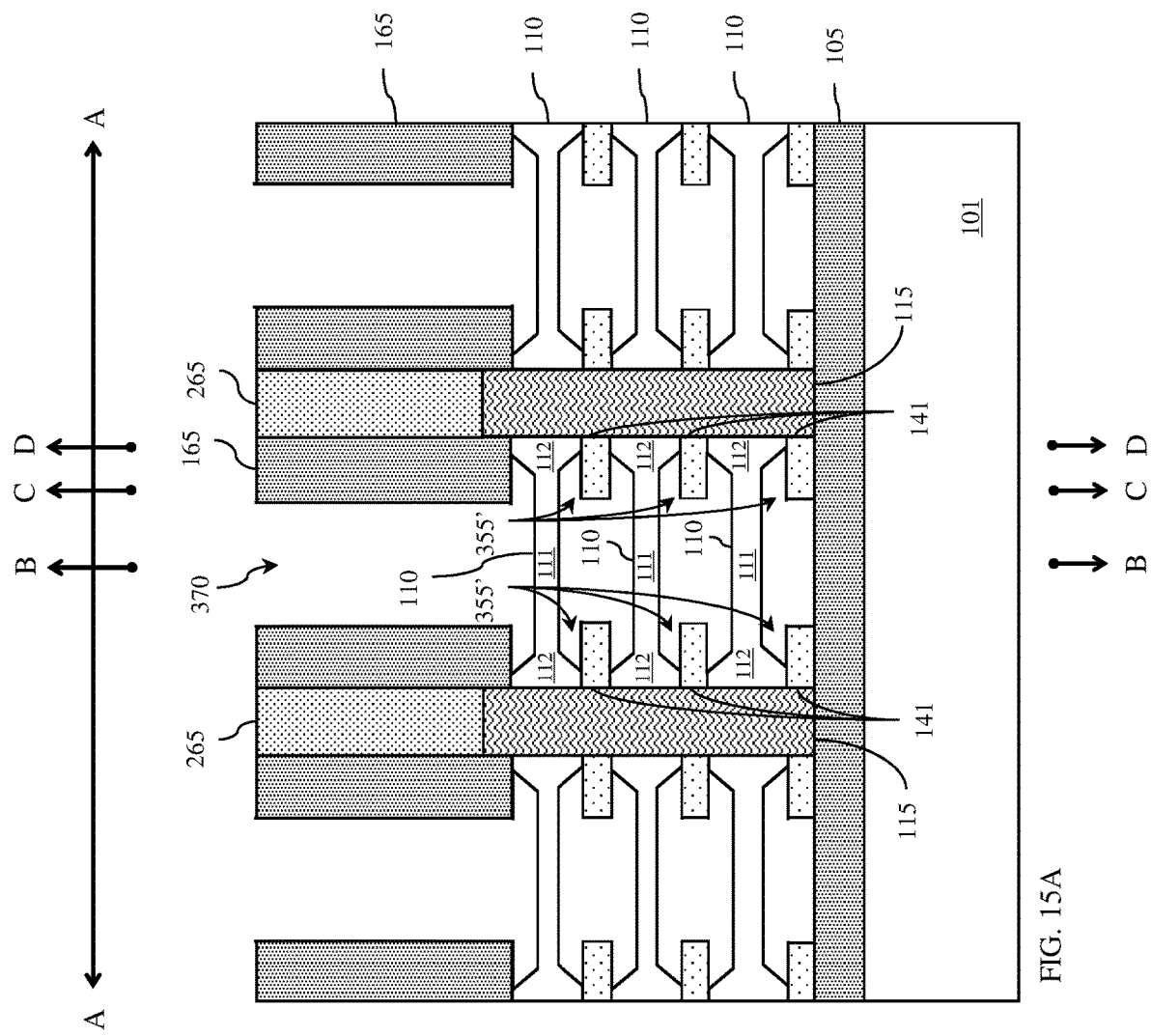
Figure 17A:
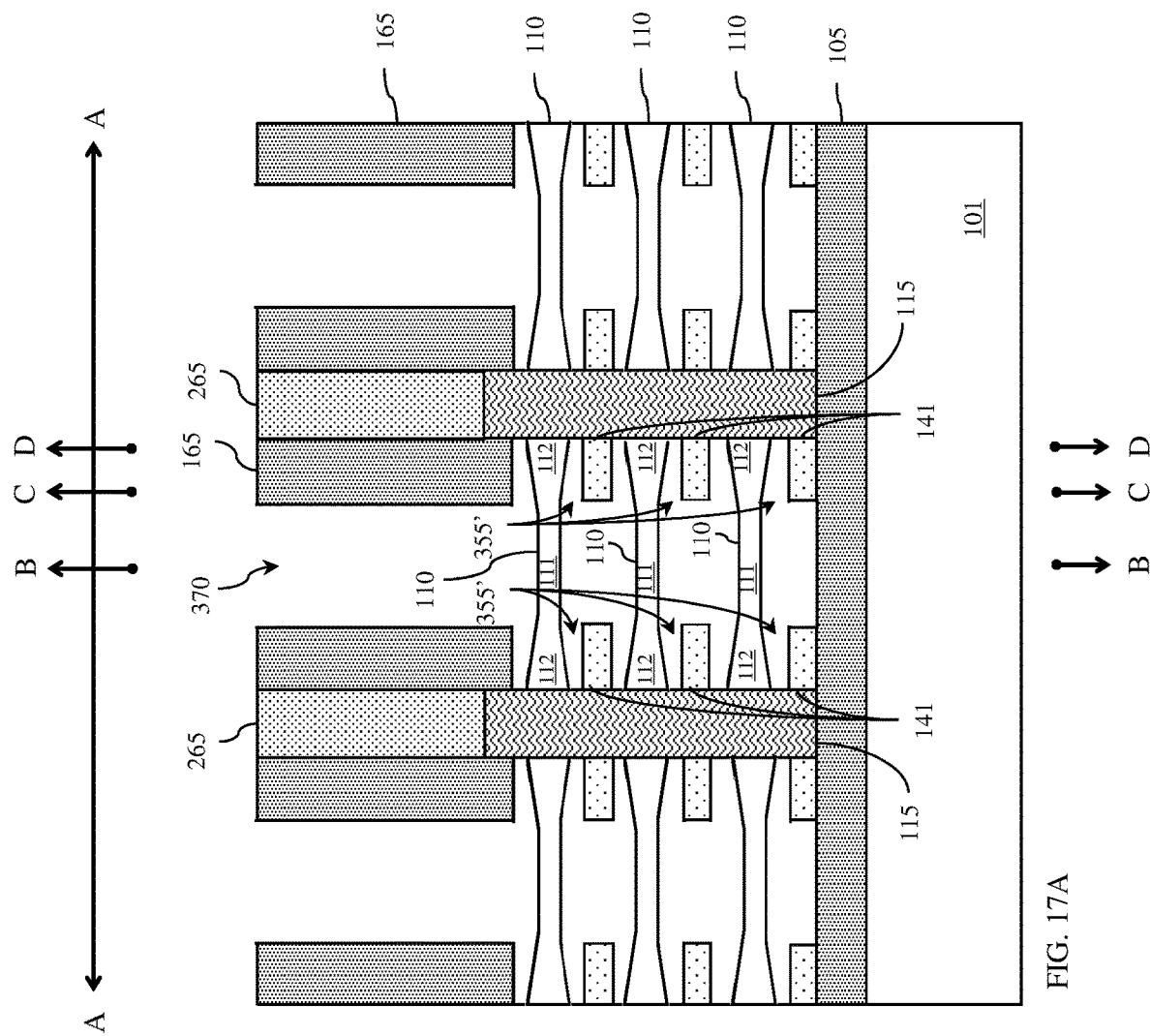
Figure 18A:
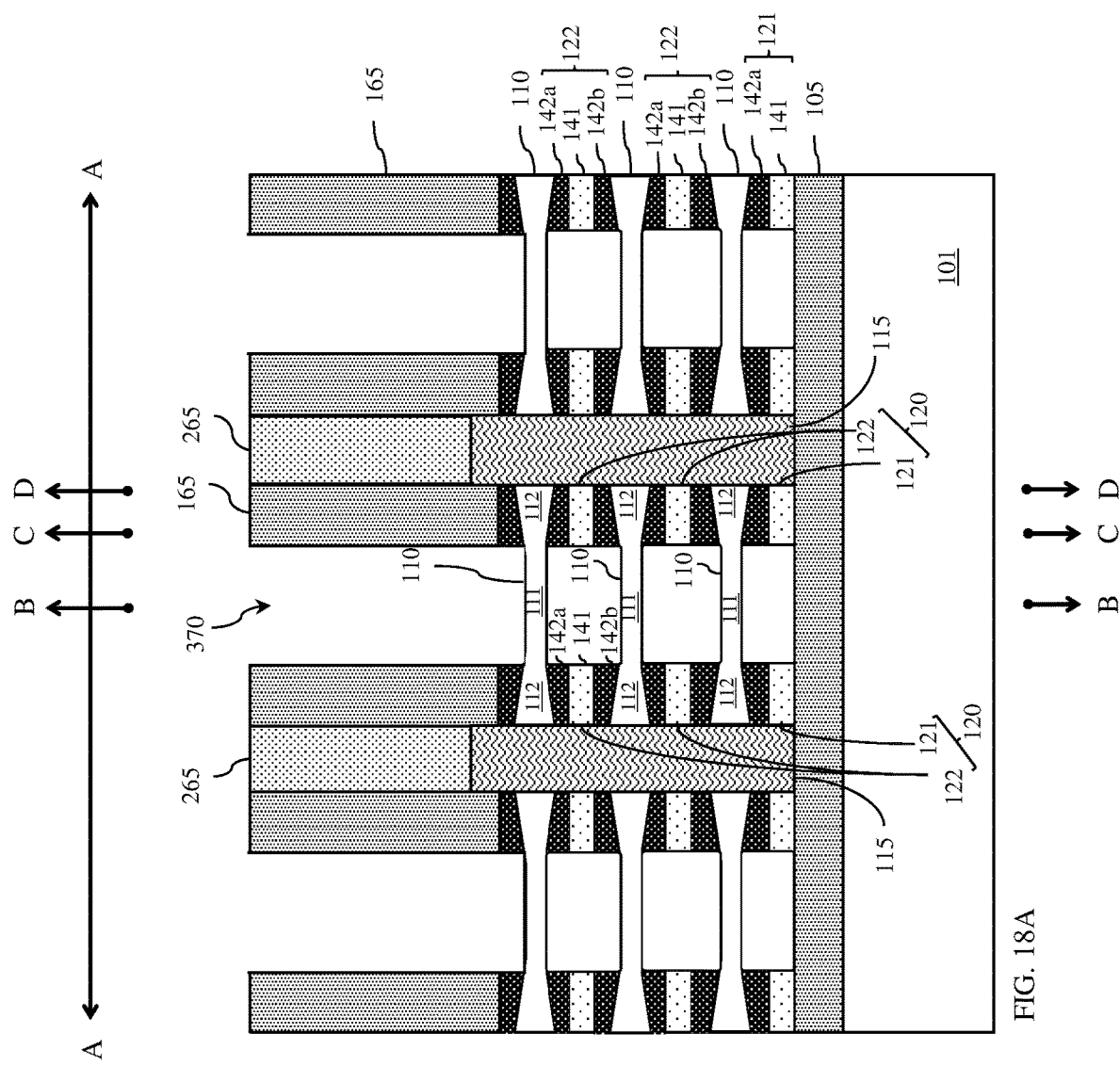
FIGS. 18A-18D are different cross-section diagrams illustrating a partially completed structure formed according to the flow diagram of FIG. 4 and specifically for the alternative GAAFET configuration shown in FIGS. 2A-2D.
Figures 18B, 18C, 18D:
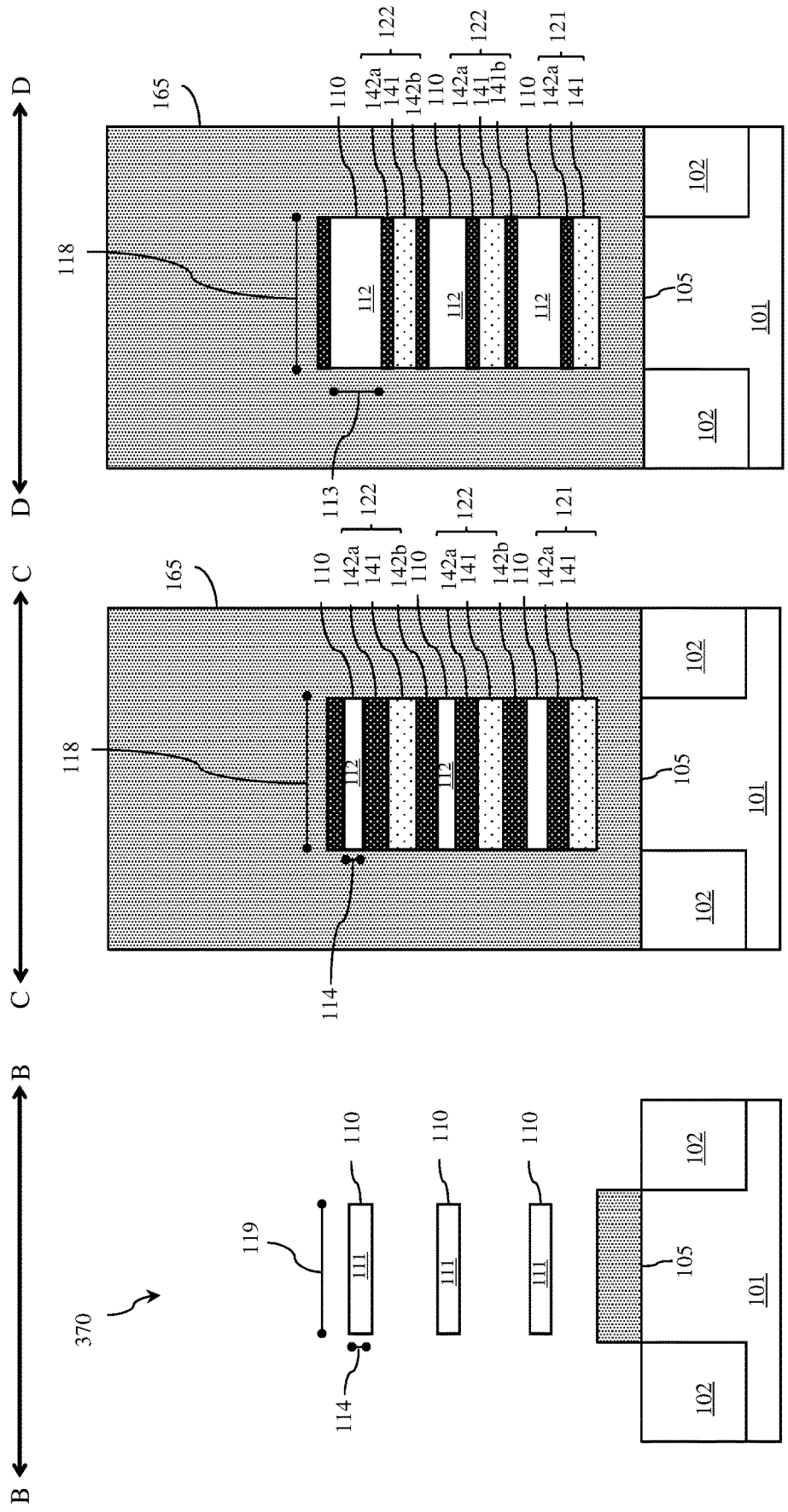

A blanket layer of interlayer dielectric (ILD) material (e.g., silicon dioxide (SiO$_2$) or any other suitable ILD material that is different from the dielectric materials of the gate sidewall spacer 165) can be deposited so as to fill the open space above the source/drain regions 115 (e.g., between gate sidewall spacers 165 on adjacent sacrificial gates) (see process step 424 and FIG. 13). The ILD material can then be polished (e.g., using a chemical mechanical polishing (CMP) process) to expose the sacrificial gate 360).

The sacrificial gate 360 can then be selectively removed, thereby creating a gate opening 370 (see process step 426 and FIGS. 14A-14D). That is, a selective etch process can be performed to selectively etch away the material of the sacrificial gate layer over the semiconductor materials of the semiconductor body 310 (i.e., over the first semiconductor material 301 and the third semiconductor material 303) and also over the dielectric materials of the gate sidewall spacer 165 and ILD, thereby creating a gate opening 370. As mentioned above, formation of the sacrificial gate 360 typically includes deposition of a thin conformal dielectric layer (e.g., a thin conformal silicon dioxide layer) prior to deposition and patterning of the sacrificial gate material. This thin conformal dielectric layer will protect the semiconductor materials during removal of the sacrificial gate 360. Following removal of the sacrificial gate 360, this conformal dielectric layer can also be removed from the gate opening 370 (e.g., by buffered hydrofluoric acid (BHF) in the case of a silicon dioxide layer).

Additionally, exposed third semiconductor material 303 of the semiconductor body 310 within the gate opening 370 can be selectively etched away (see process step 428 and FIGS. 14A-14D). For example, if the first semiconductor material 301 is silicon (Si) and the third semiconductor material 303 is silicon germanium (e.g., SiGe25%), then the SiGe can be selectively etched over the Si as well as the dielectric materials of the gate sidewall spacers 165 using any of the following exemplary processes: a hydrogen chloride (HCl) or chlorine trifluoride ($ClF_3$) vapor phase etch process, a dry plasma etch process, or a wet etch process with process specifications designed to ensure the selective etch of silicon germanium over silicon and various dielectric materials. Alternatively, any other suitable isotropic selective etch process that selectively etches silicon germanium could be used.

Following removal of the third semiconductor material 303, the remaining layers of the first semiconductor material 301 will form distinct semiconductor nanosheets 110. As illustrated, these nanosheets 110 have an essentially uniform thickness, extend laterally between the source/drain regions 115 and are stacked vertically. The lowermost nanosheet is above, parallel to, and physically separated from the isolation layer 105. One or more additional nanosheets are stacked one above the other such that they are physically separated from and parallel to each other. The number of nanosheets will depend upon the number of layers of the first semiconductor material 301 previously formed at process step 404. In any case, each nanosheet 110 has end portions 112 positioned laterally immediately adjacent to the source/drain regions 115 and a center portion 111 positioned laterally between the end portions 112. The end portions 112 are aligned with the gate sidewall spacers 165 and the previously formed inner spacer cavities that contained the first spacer layers 141 such that they are not exposed within the gate opening 370 immediately following process steps 426-428. The center portions 111 of the nanosheets 110 (including top, bottom and side surfaces of each center portion of each nanosheet) are exposed.

In conventional GAAFET processing, a replacement metal gate (RMG) is typically formed in the gate opening once the nanosheets are formed. In the disclosed method embodiments, the layers of the first semiconductor material 301 are relatively thick and the layers of the third semiconductor material 303 are relatively thin such that the nanosheets 110 formed at process step 428 are relatively thick and separated by relatively small separation distance. Therefore, before the RMG is formed, the center portions 111 of the nanosheets 110 are first thinned to increase the separation distance between adjacent center portions 111 of the nanosheets 110 (see process step 430 and FIGS. 15A-15D). It should be noted that this thinning process step 430 is specifically performed in a manner that, not only thins the center portion, but also causes the end portions 112 of the nanosheets 110 to become tapered from the source/drain regions 115 toward the center portion, thereby enlarging the inner spacer cavities in areas above and, in all but the lowermost inner spacer cavity, below the first spacer layers 141. That is, as a a result of the thinning process step 430, the end portions 112 of each nanosheet 110 will be tapered with each nanosheet 110 having a maximum nanosheet thickness 113 at the source/drain regions 115 and a minimum nanosheet thickness 114 that is less than the maximum nanosheet thickness 113 near the center portion 111 and further across the center portion 111. Additionally, enlarged inner spacer cavities 355' are created by opening up the areas above all of the first spacer layers 141 (thereby exposing the planar top surfaces of all of the first spacer layers 141) and below all but the lowermost first spacer layer (thereby also exposing the planar bottom surfaces of all but the lowermost first spacer layer).

To thin the center portions 111 of the nanosheets 110 at process step 430, exposed semiconductor surfaces of the first semiconductor material 301 of the center portion 111 of each nanosheet 110 within the gate opening 370 can be oxidized in a controlled fashion so that the oxidation depth can be selectively controlled. Then, a chemical oxide removal (COR) process can be performed in order to remove the oxide material from the remaining first semiconductor material, thereby effectively thinning the center portion 111 of each of the nanosheets 110 by some selectively controlled amount. For example, if the initial thickness of each nanosheet is 13 nm, the oxidation process can be performed so as to oxidize the exposed semiconductor surfaces of the first semiconductor material 301 to a depth of approximately 4 nm and, thus, the final thickness of the center portion 111 of each nanosheet will be approximately 5 nm. It should be noted that the first spacer layers 141 will protect the end portions 112 of the nanosheets 110 when this thinning process is first initiated such that those end portions only begin to be etched and top and bottom surfaces of the first spacer layers only begin to be exposed toward the end of the thinning process.

The method can further include conformally depositing a second dielectric spacer material into the gate opening 370 and enlarged inner spacer cavities 355' adjacent to exposed surfaces of the first spacer layer 141 and then etching back this second dielectric spacer material to create inner spacers 120 within each of the enlarged inner spacer cavities 355' (see process steps 432-434 and FIGS. 16A-16D). Specifically, at process step 432, a second dielectric spacer material can be conformally deposited into the gate opening 370 and further into the enlarged inner spacer cavities 355' through open proximal ends above and, if applicable, below the first spacer layer 141. This second dielectric spacer material can be the same material used for the first spacer layers 141 (e.g., silicon nitride (SiN). Alternatively, the second dielectric spacer material could be a different dielectric spacer material than that used for the first spacer layers 141. For example, this second dielectric spacer material could be some low-K dielectric material, which is also different from the dielectric materials of the interlayer dielectric (ILD) layer(s), the gate sidewall spacers 165, and the isolation layer 105. Thus, for example, if the ILD material is silicon dioxide ($SiO_2$) and the isolation layer 105 and gate sidewall spacers 165 are made of silicon boron carbonitride (SiBCN), silicon oxycarbonitride (SiOCN), or silicon carbonitride (SiCN), then this second dielectric spacer material could be silicon oxycarbide (SiOC). It should be understood that the exemplary combination of materials mentioned above is not intended to be limiting and that alternative combinations could be employed. For example, if ILD material is silicon dioxide ($SiO_2$) and the isolation layer 105 and gate sidewall spacers 165 are made of silicon boron carbonitride (SiBCN), then this dielectric spacer material could be silicon oxycarbide (SiOC), silicon oxycarbonitride (SiOCN), or silicon carbonitride (SiCN) and so on.

In any case, once the second dielectric spacer material is conformally deposited, it can be selectively and isotropically etched (see process step 434). This etch process can be performed so as to remove any excess second dielectric spacer material from the gate opening 370 (e.g., to re-expose the center portions 111 of each of the nanosheets 110) and so as to leave a second spacer layer 142a on the exposed planar top surface of each first spacer layer 141 in each of the enlarged inner spacer cavities 355' and a third spacer layer 142b on the exposed planar bottom surface of all but the lowermost first spacer layer. Thus, as illustrated in FIGS. 16A-16D, in the partially completed structure following process step 430, the resulting inner spacers 120 will extend laterally between the gate opening 370 and adjacent source/drain regions 115, will include first inner spacers 121 (also referred to herein as the lowermost inner spacers) between the isolation layer 105 and the end portions 112 of the lowermost nanosheet, and will also include second inner spacers 122 (also referred to herein as upper inner spacers) between the end portions 112 of adjacent nanosheets. Within each of the inner spacers 120 (including the first inner spacers 121 and the second inner spacers 122), the second spacer layer 142a can be on the planar top surface of a first spacer layer 141, can extend laterally from the gate opening 370 toward the adjacent source/drain region 115, and can extend vertically between and be in contact with the planar top surface of the first spacer layer 141 and the non-planar bottom surface of a tapered end portion 112 of the nanosheet 110 directly above such that the second spacer layer 142a has a non-uniform width. Additionally, within each second inner spacer 122, the third spacer layer 142b can be on the planar bottom surface of a first spacer layer 141, can extend laterally from the gate opening 370 toward the adjacent source/drain region, and can extend vertically between and be in contact with the planar bottom surface of the first spacer layer 141 and the non-planar top surface of a tapered end portion 112 of the nanosheet 110 directly below such that the third spacer layer 142b has a non-uniform width.

It should be noted that in different method embodiments disclosed herein the process steps 430-434 may be varied so that the resulting GAAFET structures 100, 100', 100" vary, as illustrated.

For example, the process step 430 of thinning the center portions 111 of the nanosheets 110 can be performed such that vertical surfaces of the source/drain regions 115 are not exposed (as shown in FIGS. 15A-15D). In this case, process steps 432-434 will result in inner spacers 120, as shown in FIGS. 16A-16D, where the second spacer layer 142a is shorter in length than the first spacer layer 141, is in contact with a corresponding internal portion 160 of the gate 164 at one end and is physically separated at the opposite end from the adjacent source/drain region 115 by the tapered end portion 112 of the nanosheet directly above and where the third spacer layer 142b (which as mentioned above is in all but the lowermost inner spacers) is also shorter in length than the first spacer layer 141 and is physically separated from the adjacent source/drain region 115 by the tapered end portion of the nanosheet directly below.

Alternatively, the process step 430 of thinning the center portions 111 of the nanosheets 110 can be performed such that vertical surface areas of the source/drain regions 115 are exposed above and below the end portions (as shown in FIGS. 17A-17D). In this case, process steps 432-434 can result in inner spacers 120 (as shown in FIGS. 18A-18D) where the second spacer second spacer layer 142a has essentially the same length 117 as the first spacer layer 141 and is positioned laterally between and in contact with the sidewall of the corresponding internal portion 160 of the gate 164 and the sidewall of the adjacent source/drain region 115 and where the third spacer layer 142b (which as mentioned above is in all but the lowermost inner spacers) also has essentially the same length 117 as the first spacer layer 141 and is positioned laterally between and in contact with the sidewall of the corresponding internal portion 160 of the gate 164 and the sidewall of the adjacent source/drain region 115.

Figure 19:
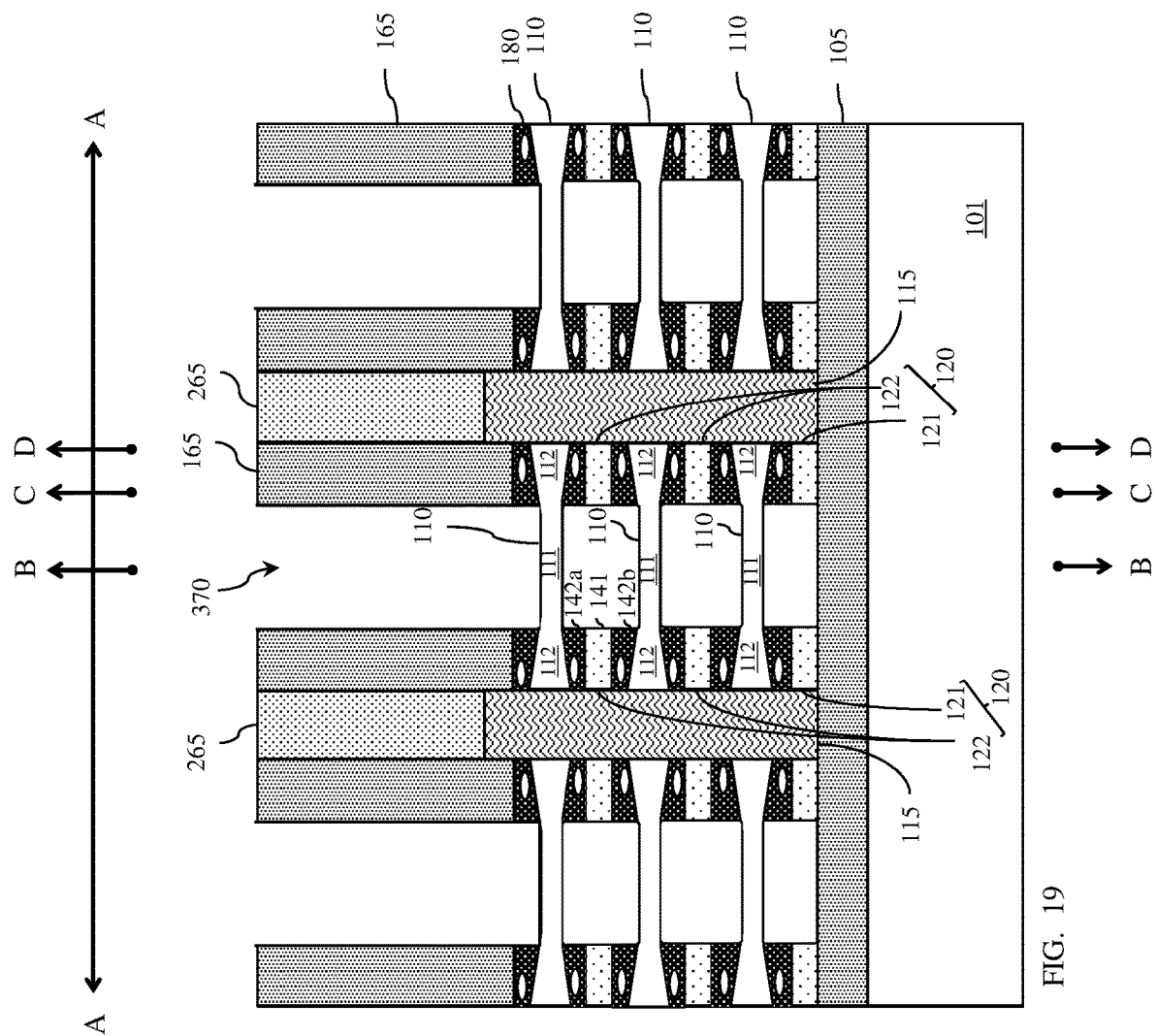
FIG. 19 is a cross-section diagram illustrating a partially completed structure formed according to the flow diagram of FIG. 4 and specifically for the additional alternative GAAFET configuration shown in FIG. 3.

Additionally, the process step 432 in either case can be performed such that when the second dielectric spacer material is conformally deposited at process step 432 and then etched back at process step 434, the resulting inner spacers 120 include solid second and third spacer layers 142a-142b that completely fill any spaces between the first spacer layer 141 and the adjacent end portions of the nanosheets above and below (e.g., as shown in FIGS. 16A-16D or FIGS. 18A-18D). However, alternatively, the second dielectric spacer material could be conformally deposited such that the resulting inner spacers 120 include second and third spacer layers 142a-142b that contain air-gaps 180 (e.g., as shown in FIG. 19).

Next, a gate 164 can be formed in the gate opening 370 above and immediately adjacent to the isolation layer 105 and further wrapping around (i.e., adjacent to the top, bottom and side surfaces) of the center portion 111 of each nanosheet 110 (see process step 436 and the GAAFET 100 if FIGS. 1A-1E, the GAAFET 100' of FIGS. 2A-2D and the GAAFET 100" of FIG. 3). The resulting gate 164 will have an external portion 163 that extends horizontally across the width of the device above and immediately adjacent to the center portion 111 of the uppermost nanosheet and will further extend vertically along opposing sides of the device. The resulting gate 164 will also have a first internal portion 161, which extends vertically from the isolation layer 105 to the center portion 111 of the lowermost nanosheet and which extends laterally between a pair of first inner spacers 121, and second internal portion(s) 162, which extend vertically between the center portions 111 of adjacent nanosheets 110 and which extend laterally between corresponding pairs of second inner spacers 122. The gate 164 can be formed at process step 436 using conventional replacement metal gate (RMG) formation techniques. That is, a gate dielectric layer (e.g., a high-K gate dielectric layer) can be conformally deposited so that the exposed surfaces of the nanosheets within gate opening are covered. Then, one or more gate conductor layers (e.g., one or more conformal work function metal layer, a fill metal layer, etc.) can be deposited on the gate dielectric layer. Various different RMG processing techniques are well known in the art and, thus, the details have been omitted from this specification in order to allow the reader to focus on the salient aspects of the disclosed method.

A dielectric gate cap 169 can also be formed on the gate 164. For example, the conductive fill material within the gate opening can be recessed (i.e., etched back) and a dielectric cap layer (e.g., a silicon nitride (SiN) cap layer) can be deposited over the partially completed structure. A polishing process (e.g., a CMP process) can be performed so as to remove any of the dielectric cap material from above the top surface of the ILD material 265 and gate sidewall spacers 165, thereby forming the dielectric gate cap 169.

Additional processing can be performed in order to complete the semiconductor structure. This additional processing can include, but is not limited to, formation of metal plugs 198 on the source/drain regions 115, formation of middle of the line (MOL) contacts, formation of back end of the line (BEOL) wiring, etc.

As mentioned above, with device size scaling and, particularly, as gate pitch decreases with each new technology node, prior art techniques for forming the inner spacers for GAAFETs in the walls of the source/drain recesses before source/drain region formation by depositing dielectric spacer material into the narrow open space between adjacent gates suffer from dielectric spacer material pinch-off, which makes removing the excess dielectric spacer material from the source/drain recesses difficult. The method embodiments disclosed herein avoid this problem by forming relatively small (short) inner spacer cavities the walls of the source/drain recesses 350 and filling the inner spacer cavities with a relatively thin conformal layer of a first dielectric spacer material before source/drain region 115 formation. Additional processing is subsequently performed through the gate opening 370, which is created by sacrificial gate removal. This additional processing includes thinning the center portions of the nanosheets and concurrently enlarging the inner spacer cavities around the first spacer layer 141. A relatively thick conformal layer of a second dielectric spacer material can then be deposited into the gate opening and enlarged inner spacer cavities above above and below he first spacer layers 141 without suffering pinch-off in the gate opening 370 because the gate opening 370 is typically significantly larger than the opening between adjacent gates. An additional advantage of the disclosed method is the potential for the formation of air-gaps 180 within the inner spacers 120 to further reduce parasitic gate-to-source/drain capacitance.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transistor comprising:
   source/drain regions;
   a stack of semiconductor nanosheets, wherein each nanosheet has end portions adjacent to the source/drain regions, respectively, and a center portion positioned laterally between the end portions;
   a gate comprising internal portions aligned below center portions of the nanosheets; and
   inner spacers aligned below the end portions of the nanosheets and further positioned laterally adjacent to the internal portions of the gate,
   wherein each end portions of each nanosheet is tapered toward the gate, and wherein each inner spacer aligned below each end portion of each nanosheet and positioned laterally adjacent to an internal portion of the gate is tapered toward an adjacent source/drain region, is multi-layered, and comprises:
  a first spacer layer positioned laterally between and in contact with a sidewall of the internal portion of the gate and a sidewall of the adjacent source/drain region; and
  a second spacer layer extending vertically between and in contact with a top surface of the first spacer layer and a bottom surface of the end portion of the nanosheet and further positioned laterally immediately adjacent to the sidewall of the internal portion of the gate.

2. The transistor of claim 1,
wherein the gate further comprises an external portion above the center portion of an uppermost nanosheet in the stack,
wherein the transistor further comprises gate sidewall spacers on opposing sides of the external portion of the gate and aligned above the end portions of the uppermost nanosheet in the stack,
wherein the gate sidewall spacers, the inner spacers, and the end portions of each nanosheet have equal lengths,
wherein each end portion of each nanosheet has a maximum nanosheet thickness that is measurable adjacent to the source/drain regions and a minimum nanosheet thickness that is less than the maximum nanosheet thickness and that is measurable between the source/drain regions and the gate,
wherein each center portion of each nanosheet has the minimum nanosheet thickness measurable across an entire length of the center portion,
wherein each inner spacer has a maximum spacer thickness that is measurable adjacent to the gate and a minimum spacer thickness that is less than the maximum spacer thickness and measurable between the gate and the adjacent source/drain region, and
wherein the top surface of the first spacer layer of each inner spacer is a planar top surface and the bottom surface of each end portion of each nanosheet is a non-planar bottom surface and the second spacer layer at least partially fills a space between the planar top surface and the non-planar bottom surface.

3. The transistor of claim 1, wherein the first spacer layer and the second spacer layer comprise different dielectric spacer materials.

4. The transistor of claim 1,
wherein the internal portions of the gate comprises:
  a first internal portion extending vertically from an isolation layer to the center portion of a lowermost nanosheet in the stack and positioned laterally between first inner spacers; and
  at least one second internal portion extending vertically between adjacent nanosheets in the stack and positioned laterally between second inner spacers,
  wherein a height of the first internal portion is less than a height of the second internal portion,
wherein the first spacer layer of each first inner spacer is above and immediately adjacent to the isolation layer, and
wherein the first spacer layer of each second inner spacer is stacked between a third spacer layer and the second spacer layer.

5. The transistor of claim 1, wherein, within each nanosheet, the center portion comprises a channel region and the end portions comprise source/drain extension regions.

6. The transistor of claim 1, wherein the second spacer layer is positioned laterally between and in contact with the sidewall of the gate and the sidewall of the adjacent source/drain region.

7. The transistor of claim 1, wherein each inner spacer further comprises an air-gap in the second spacer layer.

8. A transistor comprising:
source/drain regions;
a stack of semiconductor nanosheets, wherein each nanosheet has end portions adjacent to the source/drain regions, respectively, and a center portion positioned laterally between the end portions;
a gate comprising internal portions aligned below center portions of the nanosheets; and
inner spacers aligned below the end portions of the nanosheets and further positioned laterally adjacent to the internal portions of the gate,
wherein each end portions of each nanosheet is tapered toward the gate, and
wherein each inner spacer aligned below each end portion of each nanosheet and positioned laterally adjacent to an internal portion of the gate is tapered toward an adjacent source/drain region, is multi-layered and comprises:
  a first spacer layer positioned laterally between and in contact with a sidewall of an internal portion of the gate and a sidewall of the adjacent source/drain region; and
  a second spacer layer extending vertically between and in contact with a top surface of the first spacer layer and a bottom surface of the end portion of the nanosheet and further positioned laterally immediately adjacent to the sidewall of the internal portion of the gate, wherein the second spacer layer is shorter in length than the first spacer layer and is physically separated from the sidewall of the adjacent source/drain region by a section of the end portion of the nanosheet where the bottom surface of the end portion of the nanosheet is in contact with the top surface of the first spacer layer.

9. The transistor of claim 8,
wherein the gate further comprises an external portion above the center portion of an uppermost nanosheet in the stack,
wherein the transistor further comprises gate sidewall spacers on opposing sides of the external portion of the gate and aligned above the end portions of the uppermost nanosheet in the stack,
wherein the gate sidewall spacers, the inner spacers, and the end portions of each nanosheet have equal lengths,
wherein each end portion of each nanosheet has a maximum nanosheet thickness measurable adjacent to the source/drain regions and a minimum nanosheet thickness that is less than the maximum nanosheet thickness and that is measurable between the source/drain regions and the gate,
wherein each center portion of each nanosheet has the minimum nanosheet thickness measurable across an entire length of the center portion,
wherein each inner spacer has a maximum spacer thickness that is measurable adjacent to the gate and a minimum spacer thickness that is less than the maximum spacer thickness and measurable between the gate and the adjacent source/drain region, and wherein the top surface of the first spacer layer of each inner spacer is a planar top surface and the bottom surface of each end portion of each nanosheet is a non-planar bottom surface and the second spacer layer fills a space between the planar top surface and the non-planar bottom surface.

10. The transistor of claim 8, wherein the first spacer layer and the second spacer layer comprise different dielectric spacer materials.

11. A method comprising:

forming a stack of semiconductor nanosheets between source/drain regions, wherein each nanosheet has end portions positioned laterally adjacent to the source/drain regions, respectively, and a center portion positioned laterally between the end portions and exposed within a gate opening, and wherein each end portion of each nanosheet is tapered toward the gate opening;

forming inner spacers in inner spacer cavities aligned below the end portions of the nanosheets, wherein each inner spacer in each inner spacer cavity aligned below each end portion of each nanosheet is tapered toward an adjacent source/drain region, is multi-layered and comprises:

a first spacer layer positioned laterally between the gate opening and a sidewall of the adjacent source/drain region; and a second spacer layer extending vertically between and in contact with the top surface of the first spacer layer and a bottom surface of the end portion of the nanosheet and further positioned laterally adjacent to the gate opening; and forming a gate in the gate opening, wherein the forming of the gate comprises forming internal portions in gaps aligned below center portions of the nanosheets such that the inner spacers are positioned laterally adjacent to the internal portions of the gate.

12. The method of claim 11, wherein the inner spacers are formed such that the second spacer layer in each inner spacer is shorter in length than the first spacer layer and is physically separated from the sidewall of the adjacent source/drain region by a section of the end portion of the nanosheet where the bottom surface of the end portion of the nanosheet is in contact with the top surface of the first spacer layer.

13. The method of claim 11, wherein the inner spacers are formed such that the second spacer layer in each inner spacer is in contact with the sidewall of the adjacent source/drain region.

14. The method of claim 11, wherein the inner spacers are formed such that the second spacer layer in each inner spacer has an air-gap.

15. The method of claim 11, wherein the forming of the inner spacers comprises; forming the inner spacer cavities from source/drain recesses; filling the inner spacer cavities with first spacer layers; enlarging the inner spacer cavities from the gate opening, wherein the enlarging of the inner spacer cavities results in thinning of the center portions of the nanosheets and tapering of the end portions of the nanosheets so that at least planar top surfaces of the first spacer layers within the inner spacer cavities are partially exposed and separated from non-planar bottom surfaces of the end portions of the nanosheets by spaces; and filling the spaces with second spacer layers.

16. The method of claim 11, wherein the inner spacers are formed such that the first spacer layers and the second spacer layers of each inner spacer comprise different dielectric spacer materials.

17. The method of claim 11, wherein the inner spacers are formed such that the first spacer layers and the second spacer layers of each inner spacer comprise a same dielectric spacer material.

18. The method of claim 11, further comprising forming the gate opening, wherein the forming of the gate opening exposes the center portions of the nanosheets, exposes an isolation layer at a bottom of the gate opening, and leaves gate sidewall spacers aligned above the end portions of an uppermost nanosheet in the stack intact, wherein the forming of the inner spacers comprises:
forming first inner spacers between the isolation layer and the end portions of a lowermost nanosheet in the stack of semiconductor nanosheets; and forming second inner spacers between the end portions of adjacent nanosheets in the stack of semiconductor nanosheets, wherein the first spacer layer of each first inner spacer is above and immediately adjacent to the isolation layer, wherein the first spacer layer of each second inner spacer is stacked between a third spacer layer and the second spacer layer, and wherein the gate sidewall spacers, the inner spacers, and the end portions of each nanosheet have equal lengths.

19. The method of claim 18, wherein the gate is further formed so as to comprise an external portion aligned above the center portion of the uppermost nanosheet in the stack and further positioned laterally between the gate sidewall spacers.

20. The method of claim 18, wherein the gate is formed so that the internal portions comprise:

a first internal portion extending vertically from the isolation layer to the center portion of a lowermost nanosheet in the stack and positioned laterally between first inner spacers; and at least one second internal portion extending vertically between adjacent nanosheets in the stack and positioned laterally between second inner spacers, wherein a height of the first internal portion is less than a height of the second internal portion.

* * * * *